(12) United States Patent
Zhong et al.

(10) Patent No.: US 10,822,542 B2
(45) Date of Patent: Nov. 3, 2020

(54) PEROVSKITE/POLYMER COMPOSITE LUMINESCENT MATERIAL, PREPARATION METHOD AND USE

(71) Applicant: Beijing Institute of Technology, Beijing (CN)

(72) Inventors: Haizheng Zhong, Beijing (CN); Qingchao Zhou, Beijing (CN); Feng Zhang, Beijing (CN); Hailong Huang, Beijing (CN)

(73) Assignee: Zhijing Nanotech (Beijing) Co. Ltd., Beijing (CN)

( * ) Notice: Subject to any disclaimer, the term of this patent is extended or adjusted under 35 U.S.C. 154(b) by 291 days.

(21) Appl. No.: 15/574,089

(22) PCT Filed: May 13, 2016

(86) PCT No.: PCT/CN2016/082009
§ 371 (c)(1),
(2) Date: Nov. 14, 2017

(87) PCT Pub. No.: WO2016/180364
PCT Pub. Date: Nov. 17, 2016

(65) Prior Publication Data
US 2018/0298278 A1      Oct. 18, 2018

(30) Foreign Application Priority Data

May 14, 2015   (CN) .......................... 2015 1 0245596

(51) Int. Cl.
| | |
|---|---|
| C09K 11/02 | (2006.01) |
| C09K 11/06 | (2006.01) |
| C09K 11/75 | (2006.01) |
| B82Y 20/00 | (2011.01) |
| H01L 51/50 | (2006.01) |
| H01L 51/52 | (2006.01) |
| H01L 27/32 | (2006.01) |
| C09K 11/66 | (2006.01) |
| H01L 51/00 | (2006.01) |
| G02F 1/13357 | (2006.01) |
| H01L 41/18 | (2006.01) |

(52) U.S. Cl.
CPC ............ C09K 11/025 (2013.01); B82Y 20/00 (2013.01); C09K 11/06 (2013.01); C09K 11/664 (2013.01); C09K 11/665 (2013.01); C09K 11/75 (2013.01); H01L 27/32 (2013.01); H01L 51/502 (2013.01); H01L 51/5284 (2013.01); C09K 2211/188 (2013.01); G02F 1/133617 (2013.01); H01L 41/183 (2013.01); H01L 51/0003 (2013.01); H01L 51/0077 (2013.01); H01L 51/0097 (2013.01); H01L 51/5012 (2013.01); H01L 51/5036 (2013.01); H01L 2251/301 (2013.01); H01L 2251/5338 (2013.01); H01L 2251/558 (2013.01)

(58) Field of Classification Search
CPC ....... C09K 11/025; C09K 11/02; C09K 11/06; C09K 11/664; C09K 11/665
See application file for complete search history.

(56) References Cited

U.S. PATENT DOCUMENTS

| | | | |
|---|---|---|---|
| 9,905,762 B2* | 2/2018 | Wang | ................. H01L 51/0011 |
| 2002/0124790 A1 | 9/2002 | Era | |
| 2007/0087195 A1 | 4/2007 | Meyer et al. | |
| 2007/0264492 A1 | 11/2007 | Mizuno et al. | |
| 2011/0068121 A1 | 3/2011 | Pickett et al. | |
| 2012/0299466 A1 | 11/2012 | Lyons et al. | |
| 2012/0305918 A1 | 12/2012 | Shum | |
| 2014/0235773 A1 | 8/2014 | Ke et al. | |
| 2016/0115378 A1 | 4/2016 | Ezure | |
| 2017/0233645 A1 | 8/2017 | Zhong et al. | |

FOREIGN PATENT DOCUMENTS

| | | |
|---|---|---|
| CN | 102544530 | 7/2012 |
| CN | 103429701 | 12/2013 |
| CN | 103681886 | 3/2014 |
| CN | 104016590 | 9/2014 |
| CN | 104300083 | 1/2015 |
| CN | 104388089 | 3/2015 |
| CN | 104681731 | 6/2015 |
| CN | 104861958 | 8/2015 |
| JP | 2001323387 | 11/2001 |
| JP | 2007523754 | 8/2007 |
| JP | 2007302501 | 11/2007 |
| JP | 2008227330 | 9/2008 |
| JP | 2013505346 | 2/2013 |
| JP | 2014056801 | 3/2014 |

(Continued)

OTHER PUBLICATIONS

Wei et al, "Strong exciton-photon coupling in microcavities containing new fluorophenethylamine based perovskite compounds", Optics Exapress, vol. 20, No. 9, Apr. 23, 2012, pp. 10399-10405.*
Li et al, "Efficient Light-Emitting Diodes Based on Nanocrystalline Perovskite in a Dielectric Polymer Matrix", Nanoletters, 15, Feb. 24, 2015, pp. 2640-2644.*
Translation of JP 2008-227330, Sep. 25, 2008.*
Kojima et al., Highly Luminescent Lead Bromide Perovskite Nanoparticles Synthesized with Porous Alumina Media, Chemistry Letters, vol. 41, No. 4, 2012, p. 397-399, 5 pages.
Schmidt et al., Non-template Synthesis of CH3NH3PbBr3 Perovskite Nanoparticles, Journal of American Chemistry Society, 2014, 17 pages.

(Continued)

Primary Examiner — C Melissa Koslow
(74) Attorney, Agent, or Firm — Hanley, Flight & Zimmerman, LLC

(57) ABSTRACT

Provided is a composite luminescent material. The composite luminescent material comprises: a matrix; and perovskite nanoparticles. The perovskite nanoparticles are dispersed in the matrix, wherein the mass ratio of the perovskite nanoparticles matrix to the perovskite nanoparticles is 1:(1-50).

20 Claims, 5 Drawing Sheets

(56) References Cited

FOREIGN PATENT DOCUMENTS

| | | |
|---|---|---|
| JP | 2014078392 | 5/2014 |
| JP | 2014082377 | 5/2014 |
| JP | 2014156580 | 8/2014 |
| KR | 101518416 | 5/2015 |
| WO | 2004022637 | 3/2004 |
| WO | 2006110628 | 10/2006 |
| WO | 2014196319 | 12/2014 |
| WO | 2016072806 | 5/2016 |

OTHER PUBLICATIONS

The State Intellectual Property Office of People's Republic of China, First Office Action issued in connection with Chinese Application No. 201510245596.6, with English translation, dated Apr. 12, 2016, 12 pages.

Wei et al., Strong Exciton-photon Coupling in Microcavities Containing New Fluorophenethylamine Based Perovskite compounds, Optics Express, vol. 20, No. 9, Apr. 20, 2012, pp. 10399-10405, 8 pages.

Kobayashi et al., Fabrication and Dielectric Properties of the $BaTiO_3$-polymer Nano-composite Thin Films, Journal of the European Ceramic Society, vol. 28, Jul. 27, 2007, pp. 117-122, 6 pages.

Suarez et al., Recombination Study of Combined Halides (Cl, Br, I) Perovskite Solar Cells, Journal of Physical Chemistry Letters, vol. 5, Apr. 17, 2014, pp. 1628-1635, 8 pages.

The State Intellectual Property Office of People's Republic of China, Second Office Action Issued in connection with Chinese Application No. 201510245596.6, with English translation, dated Aug. 19, 2016, 10 pages.

The State Intellectual Property Office of People's Republic of China, Search Report issued in connection with Chinese Application No. 201510245596.6, with English translation, dated Apr. 12, 2016, 4 pages.

The State Intellectual Property Office of People's Republic of China, Search Report issued in connection with Chinese Application No. 201510245596.6, with English Translation, dated Aug. 19, 2016, 2 pages.

International Searching Authority, International Search Report, issued in connection with International Application No. PCT/CN2016/082009, dated Aug. 19, 2016, 6 pages.

Li et al. "Efficient Light-Emitting Diodes Based on Nanocrystalline Perovskite in a Dielectric Polymer Matrix", Nano Lett., vol. 15, Feb. 24, 2015, 5 pages.

Japanese Patent Office, First Office Action, issued in connection with Japanese Patent Application 2017-559529 dated Feb. 27, 2019, with English translation, 9 pages.

European Patent Office, Extended European Search Report, issued fin connection with European Patent Application No. 16792214.5, dated Nov. 30, 2018, 10 pages.

Keun Young Lee et al.,"Unidirectional High-Power Generation via Stress-Induced Dipole Alignment from $ZnSnO_3$ Nanocubes/Polymer Hybrid Piezoelectric Nanogenerator", Advanced Functional Materials, Wiley—VCH Verlag Gmbh & Co. KGAA, DE, vol. 24, No. I, Jan. 8, 2014, pp. 37-43, XP001588520, 7 pages.

Korean Intellectual Property Office, First Office Action, issued in connection with Korean Patent Application No. 10-2017-7035567, dated Jun. 26, 2019, with English translation, 12 pages.

Korean Intellectual Property Office, First Office Action, issued in connection with Korean Patent Application No. 10-2020-7001511, dated Apr. 10, 2020, with English translation, 8 pages.

Zhang et al., Brightly Luminescent and Color-Tunable Colloidal $CH_3NH_3PbX_3$(X = Br, I, CI) Quantum Dots Potential Alternatives for Display Technology, vol. 9, No. 4, 2015, 10 pages.

Japanese Patent Office, Search Report by Registered Search Organization, issued in connection with Japanest, Patent Application 2017-559529, dated Jan. 18, 2019, 11 pages.

Li et al., Efficient Light-Emitting Diodes based on Nano-Crystalline Perovskite in a Dielectric Polymer Matrix: Supporting Information, Nano Letters, vol. Supporting information Feb. 24, 2015, pp. 1-4, XP055524158, 5 pages.

* cited by examiner

PEROVSKITE/POLYMER COMPOSITE LUMINESCENT MATERIAL, PREPARATION METHOD AND USE

PRIORITY INFORMATION

This application claims the priority and benefits of the Chinese Patent Application No. 201510245596.6 filed with the State Intellectual Property Office on May 14, 2015, the disclosure of which are herein incorporated in their entirety by reference.

TECHNICAL FIELD

The present invention relates to the field of materials, and in particular to perovskite nanomaterial-based composite materials and the preparation method thereof. More specifically, the present invention relates to a perovskite/polymer composite luminescent material and its preparation method and use.

BACKGROUND

Perovskite initially refers to a class of ceramic oxides. German mineralogist Gustav Ross found the rock samples in the central Russian territory of the Ural Mountains in 1839, and the main component in perovskite ore is a calcium titanate ($CaTiO_3$) compound, hence the name. In crystallography, the proportion of each compound in the molecular formula (1:1:3) is used for abbreviation, and therefore it is also named a "113 structure". Ideal perovskite has a chemical formula of $ABX_3$ in which A can be over 20 elements such as $K^+$, $Na^+$, $Pb^{2+}$, $Ba^{2+}$, and B can be over 50 elements such as $Cr^{3+}$, $Nb^{5+}$, $Zr^{4+}$, while X can be consisting of O, Cl, Br, I, S, and other anions. The central metal cation B and the anion X form a coordinated octahedral structure in which A is present in the interstices of the octahedron and functions to balance the charges of the $BX_3$ anion. Later on, with more in-depth study of this class of material, it was found that in addition to the traditional inorganic cations, A can also be positively charged molecules. Organic-inorganic hybrid perovskite material is formed by replacing the atoms at the position of A within the inorganic perovskite with organic amines. For the structure of a hybrid perovskite, the organic amine is required to satisfy the restriction of the tolerance factor t when filling the interstices of inorganic octahedrons, and a three-dimensional hybrid perovskite structure will form when the tolerance factor falls within the range of $0.8 \leq t \leq 0.9$. Therefore, whether the organic amine chain can fit into the interstices depends on the atomic radii of A, B, and X. For a hybrid perovskite structure in which lead halide or stannic halide forms the inorganic layer, those that can form the three-dimensional structure are mainly short-chain amines, and common examples thereof include $CH_3NH_3MX_3$ (M=Pb, Sn) and $NH_2CH=NH_2SnI_3$; when A is a long chain amine cation, it cannot be accommodated in the interstices among adjacent octahedrons, the inorganic layer will be breached, each octahedron extends into an infinitely extending network structure through a common apex connection, the organic amine extends into the inorganic layer space through hydrogen bonds formed by the hydrogen in the amine and halogen ions, and the organic chains interact with each other via van der Waals force, thus forming the hybrid structure with alternately arranged organic and inorganic layers.

The inorganic-organic hybridized perovskite material has combined advantages of organic materials and inorganic materials on the molecular scale, and possesses not only good thermal stability, mechanical properties, and electromagnetic characteristics of the inorganic component, as well as good processibility for film formation and the like of the organic component, but also has many unique photoelectric properties by the dual action of the quantum confinement effect and the dielectric confinement effect brought about by the unique quantum well structure formed by the alternate stacking of its inorganic and organic layers. Among the various members of the perovskite family, it was found that $CH_3NH_3PbI_3$ has great application potential in the photovoltaic field because of its high absorption coefficient and large carrier mobility. In 2009, Tsutomu Miyasaka of Toin University of Yokohama firstly used a thin layer of perovskite ($CH_3NH_3PbI_3$) as a light-absorbing layer for dye-sensitized solar cells and obtained a perovskite solar cell with a photoelectric conversion efficiency of 3.8%. The cell was later improved by researchers with doubled conversion efficiency. In August 2012, laboratories of Sungkyunkwan University in Korea and Lausanne Institute of Technology led by Gritzel introduced a solid-state hole transporting material (HTM) into the solar cell, remarkably increasing the cell efficiency to 10% whiling solving the instability problem of the solar cell, and the novel perovskite solar cell may be more easily packaged than those previously using liquid electrolytes. After that, perovskite solar cells turned into a new research hotspot. In the same year, Henry Snaith of Oxford University replaced the $TiO_2$ in the solar cell with an aluminum material ($Al_2O_3$) so that the perovskite not only acted as the light absorbing layer in the cell but also as a charge transporting semiconductor material. As a result, the conversion efficiency of the perovskite solar cell was elevated to 15%. In August 2013, the research team led by the Chinese scientist Yang Yang in UCLA published a latest research paper in Science, reporting a conversion efficiency of perovskite solar cells of up to 19.3%, the highest efficiency by far, achieved by improving the perovskite structure layer and choosing a material that is more suitable for charge transporting.

Perovskite materials not only have great application prospects in the photovoltaic field, but also have unique application potentials in the fields of lighting, display, laser, photodetector and the like, due to their exciton light-emitting properties and characteristics in terms of narrow half-peak width, high luminous color purity, and suitability for electron injection, as well as ability of controlling luminescence properties by adjusting the organic and inorganic components. However, due to the intrinsic defects existed in the hybrid perovskite materials, strong excitons can only be obtained at low temperature, and the luminescence efficiency at room temperature is less than 1% of that at low temperature, which severely limits the application of these materials in the field of luminescence. If the dimension of these materials can be reduced while decreasing the grain size, the number of defects within a single grain will decrease and, together with volume shrinkage, the self-assembled arrangement will further reduce the number of defects, thereby enabling highly efficient luminescence at room temperature. In 2012, Akihiro Kojima et al reported in *Chemistry Letters* on the synthesis of a $CH_3NH_3PbBr_3$ nanoparticle using porous aluminum oxide template with an emission wavelength at 523 nm, and the luminescence of the nano-scale particles was significantly enhanced as compared to the $CH_3NH_3PbBr_3$ bulk material. However, due to the limitation of the alumina template, this material is not suitable in the field of luminescence. In 2014, Luciana C. Schmidt reported in the *Journal of American Chemistry*

*Society* on the synthesis of $CH_3NH_3PbBr_3$ nanoparticles by hot injection. In this method, ODE (1-octadecene) was used as a solvent, and under a reaction environment at 80° C., the raw materials methylamine bromide, long chain organic amine bromide, lead bromide etc. were added and uniformly dispersed in the solution, acetone was finally added thereto, and $CH_3NH_3PbBr_3$ particles were obtained by co-precipitation, showing an emission wavelength at 526 nm and a fluorescence quantum yield of up to 20%. In 2015, the group of Professor Zhong Haiheng at Beijing Institute of Technology reported in *ACS Nano* on wavelength adjustable $CH_3NH_3PbX_3$ (X=Cl, Br, I) colloidal quantum dots obtained by using the ligand-assisted re-precipitation technique, with the highest fluorescence quantum yield of up to 70%, and a LED device with ultra wide gamut of 1.3 times the NTSC area was obtained, which revealed the great application potentials of this material in wide gamut display (Patent Application No. 201410612348.6). However, the application of the perovskite quantum dots prepared by this synthetic method in a device required preliminary removal of the large amount of organic solvent introduced in the synthesis process, as well as seeking for suitable packaging materials. In the LED backlight display, high-quality fluorescent powders are needed, while remote LED devices requires films with large area and good uniformity. Therefore, it is an essential problem in the field of LED application to obtain high-quality perovskite fluorescent powders or films with large area and good uniformity.

However, the current perovskite/polymer composite luminescent materials and their preparation methods still need to be improved.

SUMMARY OF THE INVENTION

The present invention has been made based on the inventors' findings and acknowledge of the following facts and problems.

Currently, problems including low fluorescence quantum yield, poor stability and the like are general problems for perovskite nanomaterial-based polymer composite luminescent materials, such as polymer films containing perovskite nanomaterials. Upon extensive studies and tremendous experimentation, the inventors found that these are caused by the current synthesis methods of perovskite nanomaterials that generally require cumbersome purification steps to obtain the perovskite nanomaterials, for example, removal of a large amount of organic solvent and long chain surface ligands added during reactions, which may adversely affect the luminescent properties of the perovskite nanomaterials, while the perovskite nanomaterials obtained by separation and purification may also affect the dispersion of the perovskite nanomaterials in the polymer matrix and the efficacy when applied in the final device. Although the formation of composite materials by dispersing the perovskite nanomaterials into the matrix material can exhibit the properties of the perovskite nanomaterials, it is difficult for such a simple compositing process to adequately maintain the superior properties of the perovskite nanomaterials. In summary, although high fluorescence quantum yield may be achieved with current perovskite nanomaterials alone, there are still problems of low fluorescence quantum yield, poor transparency and the like for polymer-based composite materials containing perovskite nanomaterials, while the stability of resultant composite material in devices can hardly be guaranteed.

The present invention aims to solve at least one of the technical problems described above. The object of the present invention is to propose a perovskite/polymer composite luminescent material and its preparation method, and to improve the current synthesis method for perovskite quantum dots so as to establish in situ fabrication of perovskite quantum dots in a polymer matrix. The composite material thus obtained is a flexible film with high fluorescence quantum yield, thereby solving the problem of the difficulty in application of a perovskite quantum dot solution in optoelectronic devices such as backlight display.

The proposed preparation method of this invention is very simple and suitable for large-scale manufacturing and industrial production. The prepared perovskite/polymer composite luminescent materials not only have the advantages of the perovskite component of high fluorescence quantum yield, high luminescence purity, adjustable wavelength and the like, but also own the characteristics of the polymer component of easy processing, high mechanical strength, good flexibility and the like. Moreover, since the perovskite particles are enclosed within the polymer matrix, they are isolated from the impact of the external environment such as oxygen, air humidity and others, which significantly increase the fluorescence stability of the composite material and has great commercial application potentials in LED backlight display with wide color gamut and flexible display.

In one aspect of the present invention, the present invention provides a composite luminescent material. According to an embodiment of the present invention, the composite luminescent material comprises: a matrix; and perovskite nanoparticles, the perovskite nanoparticles are dispersed in the matrix, wherein the mass ratio of the perovskite nanoparticles to the matrix is 1:(1 to 50). Thus, it is possible to realize at least one advantages of the composite material of high quantum yield, high photoluminescence efficiency, high transparency, and low production cost.

According to an embodiment of the present invention, the mass ratio of the perovskite nanoparticles to the matrix is 1:(2 to 50). Thus, the photoluminescence performance of the composite luminescent material can be further improved.

According to an embodiment of the present invention, the mass ratio of the perovskite nanoparticles to the matrix is 1:(5 to 50). Thus, the photoluminescence performance of the composite luminescent material can be further improved.

According to an embodiment of the present invention, the size of the perovskite nanoparticles is no more than 10 nm in at least one dimension. Thus, the performance of the composite luminescent material can be further improved.

According to an embodiment of the present invention, the perovskite nanoparticles have a core with a formula of $CsAB_3$ or $R_1NH_3AB_3$ or $(R_2NH_3)_2AB_4$ in which A and B form a coordinated octahedral structure, with $R_1NH_3$ or $R_2NH_3$ filling the interstices of the octahedral structure, wherein $R_1$ is methyl, $R_2$ is an organic group, A is Ge, Sn, Pb, Sb, Bi, Cu or Mn, B is at least one selected from Cl, Br, I. Thus, perovskite nanoparticles with good luminescent properties can be obtained.

According to an embodiment of the present invention, the matrix is composed of polymers, wherein the polymers include at least one of polyvinylidene fluoride (PVDF), copolymer of polyvinylidene fluoride and trifluoroethylene (P(VDF-TrFE)), polyacrylonitrile (PAN), polyvinyl acetate (PVAc), cellulose acetate (CA), cyano cellulose (CNA), polysulfone (PSF), aromatic polyamide (PA), polyimide (PI), polycarbonate (PC), and polystyrene (PS). Thus, uniform dispersion of the perovskite nanomaterials in the polymer can be achieved through the interactions between electronegative groups in the polymer chains and positively charged ions of $R_1$ or $R_2$ in the perovskite component, which further has a limiting effect on the perovskite nanomaterials including the restriction to in situ growth of the perovskite nanoparticles and the movement of the formed perovskite nanoparticles in the matrix, thereby controlling the size of the perovskite nanoparticles. The above-mentioned polymers can also be used as a transparent substrate to improve the performance of the composite material eventually prepared.

According to an embodiment of the present invention, the composite luminescent material further comprises an additive, the additive being dispersed in the matrix; the additive comprises at least one of silica, boron nitride nanosheets, graphene and carbon nanotubes. Thus, the size of the perovskite nanoparticles can be further defined by using the above-mentioned additives, providing a reasonable structure for the composite material, while the additive comprised of the above nanomaterials can further improve the electrical, mechanical and other physical and chemical properties of the composite luminescent material.

According to an embodiment of the present invention, $R_2$ is a long chain organic group, an ethyl group or an aromatic group. Thus, the photoluminescence performance of the perovskite nanoparticles can be further improved.

According to an embodiment of the present invention, $R_2$ is a saturated alkyl group or an unsaturated alkyl group with more than 4 carbon atoms. Thus, the photoluminescence performance of the perovskite nanoparticles can be further improved.

According to an embodiment of the present invention, the perovskite nanoparticle further comprises a surface ligand formed on the surface of the core, the surface ligand being an organic acid or a long chain organic amine. Thus, the perovskite nanoparticles in the composite can be provided with organic hybrid groups, thereby improving the structure of the perovskite nanoparticles so as to improve the performance of the composite material.

According to an embodiment of the present invention, the organic acid includes a saturated or unsaturated alkyl acid with at least three carbon atoms; the long chain organic amine is an alkyl or aromatic amine with 4-24 carbon atoms. The organic acid or amine can be adsorbed on the surface of perovskite nanoparticles core via Van Der Waal's force, in order to effect further limitation to the perovskite nanoparticles, including restriction to in situ growth of the perovskite nanoparticles and the movement of the formed perovskite nanoparticles in the matrix. Thus, the stability of the perovskite nanoparticles can be further improved, and thereby the performance of the composite material can be improved.

In another aspect of the present invention, it proposed a perovskite/polymer composite luminescent material consisting of two parts, perovskite and polymer, wherein the perovskite particles are embedded within the interspaces among the polymer molecules, as shown in FIG. 1 (in FIG. 1, 1 indicates the perovskite particles, and 2 indicates the polymer chain), and the mass ratio of the perovskite particles to the polymer is that: perovskite:polymer=1:(1 to 50). The formula of the perovskite is $R_1NH_3AB_3$ or $(R_2NH_3)_2AB_4$ in which A and B form a coordinated octahedral structure, with $R_1NH_3$ or $R_2NH_3$ filling the interstices of the octahedral structure, wherein $R_1$ is methyl, $R_2$ is an organic group, A is any one of the metals Ge, Sn, Pb, Sb, Bi, Cu or Mn, and B is any one from Cl, Br, I. The polymer is any one of polyvinylidene fluoride (PVDF), polyvinyl acetate (PVAc), cellulose acetate (CA), polysulfone (PSF), aromatic polyamide (PA), polyimide (PI), polycarbonate (PC), polystyrene (PS).

In another aspect of the present invention, the present invention proposes a method for preparing a composite luminescent material. According to an embodiment of the present invention, the method comprises: (1) dissolving the matrix in the first organic solvent to obtain the first solution; (2) dissolving the inorganic metal halide and organic amine halide salt in the second organic solvent to obtain the second solution; (3) mixing the first solution with the second solution to form the precursor solution; (4) transferring the precursor solution onto the template; and (5) drying the template with precursor solution so as to obtain the composite luminescent material. Thus, the perovskite nanoparticle/polymer composite luminescent material can be easily obtained, with low production cost, which can be simply operated and is advantageous for large-scale promotion, and the composite luminescent material obtained has excellent performance.

According to an embodiment of the present invention, the first organic solvent and the second organic solvent are each independently selected from at least one of N,N-dimethylformamide (DMF), dimethylsulfoxide (DMSO), trimethylphosphate (TMP), triethylphosphate (TEP), N-methylpyrrolidone (NMP), and dimethylacetamide (DMAc), wherein the first organic solvent and the second organic solvent are miscible. The matrix, the inorganic metal halide, and the organic amine halide salt all have good solubility in the above organic solvents.

According to an embodiment of the present invention, the matrix is composed of polymers, wherein the polymers comprise at least one from polyvinylidene fluoride (PVDF), copolymer of polyvinylidene fluoride and trifluoroethylene (P(VDF-TrFE)), polyacrylonitrile (PAN), polyvinyl acetate (PVAc), cellulose acetate (CA), cyano cellulose (CNA), polysulfone (PSF), aromatic polyamide (PA), polyimide (PI), polycarbonate (PC), and polystyrene (PS). Thus, uniform dispersion of the perovskite nanomaterials in the polymer can be achieved through the interactions between electronegative groups in the polymer chains and positively charged ions of $R_1$ or $R_2$ in the perovskite component, which further has a limiting effect on the perovskite nanomaterials including the restriction to in situ growth of the perovskite nanoparticles and the movement of the formed perovskite nanoparticles in the matrix, thereby controlling the size of the perovskite nanoparticles. The above-mentioned polymers can also be used as a transparent substrate to improve the performance of the composite material eventually prepared.

According to an embodiment of the present invention, the inorganic metal halide is at least one of the halide salt of Ge, Sn, Pb, Sb, Bi, Cu, and Mn; and the organic amine halide salt has a general formula of $RNH_3B$, wherein R is a saturated alkyl group, an unsaturated alkyl group, or an aromatic group, and B is at least one selected from Cl, Br, or I. Thus, perovskite nanoparticles with good photoluminescence properties can be formed.

According to an embodiment of the present invention, the saturated alkyl group is methyl, ethyl, or a long chain saturated alkyl group with more than 4 carbon atoms. Thus, the photoluminescence performance of the perovskite nanoparticles can be further improved.

According to an embodiment of the present invention, the mass ratio of the matrix to the first organic solvent is 1:(1 to 50) in the first solution. Thus, a first solution with an appropriate matrix content can be obtained, so that the limiting effect of the matrix on the size of the perovskite nanoparticles can be further improved.

According to an embodiment of the present invention, the mass ratio of the matrix to the first organic solvent is 1:(2 to 50) in the first solution. Thus, a first solution with an appropriate matrix content can be obtained, so that the limiting effect of the matrix on the size of the perovskite nanoparticles can be further improved.

According to an embodiment of the present invention, the mass ratio of the matrix to the first organic solvent is 1:(5 to 50) in the first solution. Thus, a first solution with an appropriate matrix content can be obtained, so that the limiting effect of the matrix on the size of the perovskite nanoparticles can be further improved.

According to an embodiment of the present invention, in the second solution, the molar ratio of the inorganic metal halide to the organic amine halide salt or cesium halide is 1:(0.1 to 3), and the mass ratio of the second organic solvent to the inorganic metal halide is 1:(0.01 to 0.1). Thus, the ratio of the inorganic metal halide to the organic amine halide salt or cesium halide can be controlled within a relatively appropriate range, so that the properties of the formed perovskite nanoparticles can be improved.

According to an embodiment of the present invention, in the second solution, the mass ratio of the second organic solvent to sum of the inorganic metal halide and the organic amine halide salt is 1:(0.01 to 0.1). Thus, the properties of the formed perovskite nanoparticles can be further improved.

According to an embodiment of the present invention, in the precursor solution, the mass ratio of the first solution to the second solution is 1:(0.02 to 1). Thus, the performance of the composite luminescent material obtained by the method can be further improved.

According to an embodiment of the present invention, the first solution further comprises an additive which comprise at least one of silica, boron nitride nanosheets, graphene, and carbon nanotubes, and the mass ratio of the matrix to the additive is 1:(0.01 to 0.5). Thus, the size of the perovskite nanoparticles can be further defined by using the above-mentioned additive, providing a reasonable structure of the composite material, and the additive comprised of the above nanomaterials can further improve the electrical, mechanical and other physical and chemical properties of the composite luminescent material.

According to an embodiment of the present invention, after step (3) and before step (4), further comprised is: adding a surface ligand to the precursor solution, wherein the surface ligand is an organic acid or a long chain organic amine, and the mass ratio of the second solution to the surface ligand is 1:(0.001 to 0.3). Thus, the perovskite nanoparticles in the composite can be provided with organic hybrid groups so that the structure of the perovskite nanoparticles is improved, and thereby improving the performance of the composite.

According to an embodiment of the present invention, the organic acid includes a saturated or unsaturated alkyl acid with at least three carbon atoms; the long chain organic amine is an alkyl or aromatic amine with 4-24 carbon atoms. The long organic acid or amine can be adsorbed on the surface of perovskite nanoparticles core via Van Der Waal's force, in order to effect further limitation to the perovskite nanoparticles, including the restriction to in situ growth of perovskite nanoparticles and the movement of the formed perovskite nanoparticles in the matrix. Thus, the stability of the perovskite nanoparticles can be further improved, and thereby improving the performance of the composite materials.

According to the embodiment of the present invention, in step (4), the precursor solution is transferred to the template by a spin coating method, a dip coating method, an electrospinning method, a solution depositing method, a spray coating method, a blade coating method or a casting method. Thus, composite luminescent materials in the form of film or the like can be easily obtained.

According to an embodiment of the present invention, in step (5), the drying is vacuum drying at a pressure of 0.01 to 0.1 MPa and a temperature of 20 to 110° C., for a drying duration of 0.5 to 48 h. Thus, the volatilization conditions of the organic solvent system can be controlled to manage the crystallization of the matrix, the arrangement of the additive, and the nucleation and growth of the perovskite nanoparticles, and thereby improving the performance of the composite materials.

According to an embodiment of the present invention, the vacuum drying temperature is 30 to 70° C. Thus, the performance of the composite material can be further improved.

According to an embodiment of the present invention, the thickness of the composite luminescent material obtained upon vacuum drying is 0.001 to 5 mm. Thus, the performance of the composite luminescent material prepared by the method can be further improved.

According to an embodiment of the present invention, the first solution is prepared by the following steps: dissolving the matrix in the first organic solvent, with a mass ratio of the matrix to the first organic solvent of 1:(1 to 50), and mechanically stirring and mixing for 12 hours so that the matrix is completely dissolved to obtain a transparent mixed solution so as to obtain the first solution. Thus, the performance of the composite luminescent material prepared by the method can be further improved.

According to an embodiment of the present invention, the first solution is prepared by the following steps: dissolving the matrix in the first organic solvent, with a mass ratio of the matrix to the first organic solvent of 1:(1 to 50), and mechanically stirring and mixing for 12 hours so that the matrix is completely dissolved to obtain a transparent mixed solution, adding the additive into the transparent mixed solution, with a mass ratio of the matrix to the additive of 1:(0.01 to 0.5), and mechanically stirring and mixing for 1-3 h to mix uniformly and obtain the first solution. Thus, the performance of the composite luminescent material prepared by the method can be further improved by using the additive.

According to an embodiment of the present invention, the second solution is prepared by the following steps: mixing the inorganic metal halide with the organic amine halide salt or cesium halide, with a molar ratio of the inorganic metal halide to the organic amine halide salt or cesium halide of 1:(0.1 to 3), adding the obtained mixture into the second organic solvent before it is subjected to ultrasonic treatment for 15 minutes, with a mass ratio of the second organic solvent to the inorganic metal halide of 1:(0.01 to 0.1), filtering the mixture upon ultrasonic treatment, and using filtrate as the second solution. Thus, the performance of the composite luminescent material prepared by the method can be further improved.

According to an embodiment of the present invention, the mass ratio of the second organic solvent to the sum of the inorganic metal halide and the organic amine halide is 1:(0.01 to 0.1). Thus, the performance of the composite luminescent material prepared by the method can be further improved.

According to an embodiment of the present invention, the first solution and the second solution are mixed with a mass ratio of the first solution to the second solution of 1:(0.02 to 1), and mechanically stirred for 2 hours so as to obtain the precursor solution. Thus, the performance of the composite luminescent material prepared by the method can be further improved.

According to an embodiment of the present invention, the precursor solution is prepared by the following steps: mixing the first solution and the second solution, with a mass ratio of the first solution to the second solution of 1:(0.02 to 1), adding a surface ligand, with a mass ratio of the second solution to the surface ligand of 1:(0.001 to 0.3), and mechanically stirring for 2 h so as to obtain the precursor solution. Thus, the performance of the composite luminescent material prepared by the method can be further improved by introducing the surface ligand.

In another aspect of the present invention, the present invention provides a preparation method for the above described perovskite/polymer composite luminescent material, which comprises the following steps:

(1) dissolving the polymer in an organic solvent while controlling the mass percentage concentration as: polymer: organic solvent=1:(1 to 50), and ultrasonic mixing for 12 hours; once the polymer is completely dissolved, adding the additive to the homogeneous viscous polymer solution thus obtained, while controlling the mass percentage concentration as: polymer solution:additive=1:(0 to 0.5), and ultrasonic mixing for 1-3 hours to mix uniformly and obtained the first solution; wherein, the polymer is any one of polyvinylidene fluoride (PVDF), polyvinyl acetate (PVAc), cellulose acetate (CA), polysulfone (PSF), aromatic polyamide (PA), polyimide (PI), polycarbonate (PC), polystyrene (PS); the additive is any one of polyvinylpyrrolidone (PVP) and polyethylene glycol (PEG); the organic solvent is any one of N,N-dimethylformamide (DMF), dimethyl sulfoxide (DMSO), trimethyl phosphate (TMP), triethyl phosphate (TEP), N-methylpyrrolidone (NMP), dimethylacetamide (DMAc);

(2) mixing the inorganic halide salt and the organic amine halide powder are mixed while controlling the molar ratio of the inorganic halide salt:the organic amine halide salt=1:(0.1-3), followed by addition of the organic solvent while controlling the mass percentage concentration as: the organic solvent:the inorganic halide salt=1:(0.01 to 0.1); upon mixing, conducting ultrasonic treating for 15 minutes to obtain a transparent mixed solution, subjecting the ultrasonic treated mixed solution to filtering, and using the filtrate as the second solution; wherein, the inorganic halide salt described in this step is any one of the halide salt of metal Ge, Sn, Pb, Sb, Bi, Cu, and Mn; and the organic solvent is any one of N,N-dimethylformamide (DMF), dimethylsulfoxide (DMSO), trimethylphosphate (TMP), triethyl phosphate (TEP), N-methylpyrrolidone (NMP), and dimethylacetamide (DMAc); the organic amine halide salt is a saturated alkylamine halide salt with a general formula of $C_nH_{2n+1}NB_3$ ($n \geq 1$, B is any one of Cl, Br, and I) or an unsaturated alkylamine halide salt or aromatic amine halide salt with a general formula of $C_nH_{2n-1}NB_3$ ($n \geq 2$, B is any of Cl, Br, I);

(3) mixing the first solution described in step (1) with the second solution described in step (2) while controlling the volume ratio of the first solution:the second solution=1:(0.02 to 1), and subjecting to ultrasonic treatment for 2 h to obtain a uniformly mixed precursor solution;

(4) transferring the precursor solution described in the above step (3) to a transparent substrate or mold by a spin coating method, a dip coating method, an electrospinning method, a solution depositing method, a spray coating method, or a casting method such that the precursor solution is uniform spread while the thickness of the precursor solution on the transparent substrate or mold is controlled to be 0.001 to 5 mm, and then placing the substrate or mold coated with the precursor solution in a vacuum drying oven at a pressure of 0.01 to 0.1 MPa and a temperature of 30 to 70° C. for 0.5 to 48 h drying, so as to remove the organic solvent and obtain the perovskite/polymer composite luminescent material.

The preparation method for the perovskite/polymer composite luminescent material proposed in the present invention has the following advantages:

1. The preparation method of the present invention can be simply operated with low cost and no restriction for batch preparation, which is suitable for industrial production and may produce large area perovskite/polymer composite light-emitting films.

2. In the perovskite nanoparticle-based composite material prepared by the method of the present invention, the dimensional growth of the perovskite can be limited by the interspaces among the polymer molecules, and the raw materials are saved and the interspaces among the polymer molecules are easily adjustable.

3. Perovskite/polymer composite luminescent materials with different particle diameters and compositions can be prepared by the method of the present invention, with high luminous intensity, a fluorescence quantum yield of up to 80-90%, and an emission wavelength spanning across the entire visible region.

4. The perovskite/polymer composite luminescent material prepared by the method of the present invention has significantly enhanced stability and chemical corrosion resistance because the light emission is insensitive to the external environment owning to the encapsulation of the perovskite particles in the polymer matrix which averts the influence of oxygen, air humidity and the like.

5. The perovskite/polymer composite luminescent material prepared by the method of the present invention is characteristic in terms of high mechanical strength and good flexibility, which has application potential in flexible display devices.

6. The perovskite/polymer composite luminescent material prepared by the method of the present invention has a narrow half peak width and high luminous color purity, which can meet the needs of practical application and has wide application prospects in the fields of wide color gamut LED display, laser and nonlinear optics, etc.

In another aspect of the present invention, the present invention proposes a semiconductor device. According to an embodiment of the present invention, the semiconductor device contains the composite luminescent material described above. Thus, the above-mentioned polymer-containing composite luminescent material can be used directly as a relevant structure in a semiconductor device, so that the manufacturing process of the semiconductor device can be simplified, the production cost can be reduced and the performance of the semiconductor device can be guaranteed as well.

According to an embodiment of the present invention, the semiconductor device is an electroluminescent device, a photoluminescent device, a solar cell, a display device, a sensing device, a piezoelectric device, or a nonlinear optical device. Thus, the performance of the above-mentioned semiconductor device can be further improved.

According to an embodiment of the present invention, the semiconductor device is a flexible device. Thus, the performance of the above-mentioned semiconductor device can be further improved.

According to an embodiment of the present invention, the substrate of the flexible device is formed by the composite luminescent material. Thus, the material can be directly used as a substrate for the flexible device due to the flexibility of the polymer matrix in the composite luminescent material, so that the substrate would also has the luminous properties of the perovskite nanoparticles.

According to an embodiment of the present invention, the semiconductor device is an LCD display device, and the composite luminescent material is arranged in a backlight module of the LCD display device. Thus, the above-mentioned composite luminescent material can be used to improve the luminous efficiency and effectiveness of the backlight module.

DESCRIPTION OF REFERENCE NUMBERS

Figure 1:
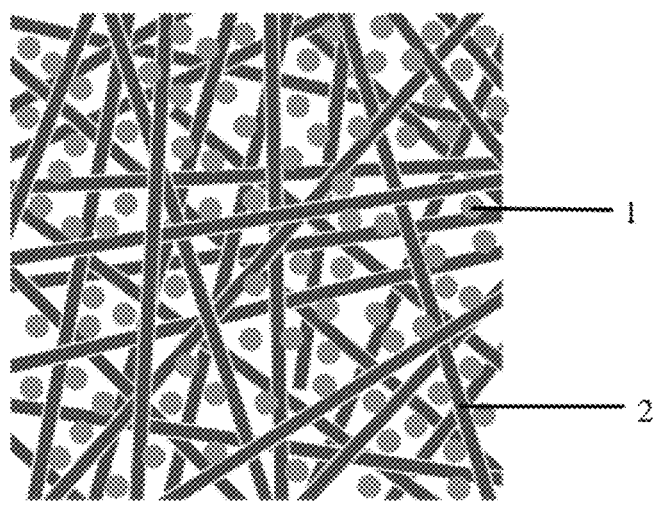
FIG. 1 is a schematic diagram of the structure of the composite luminescent material prepared by the method of the present invention.

1: Perovskite nanoparticle; 2: Matrix.

DETAILED DESCRIPTION OF THE INVENTION

Examples of the present invention will be described in details hereinafter, with particular examples illustrated in the drawings in which identical or similar reference numbers indicate identical or similar elements or elements having identical or similar functions. The examples described below with reference to the drawings are only illustrative for the explanation of the present invention, and cannot be construed as limitation thereto.

For better understanding, firstly, the principles underlining the preparation of the perovskite nanoparticles based composite materials by the method of the present invention will be briefly described as below.

Components of the raw material including the inorganic metal halide, the organic amine halide, the surface ligands, the polymer matrix, and the additive can be dissolved in the same organic solvent system where they can be uniform dispersed without any phase separation in both macro- and microstructures. When the organic solvent system gradually evaporates under external actions, on the one hand, the matrix begins to accumulate as the solvent evaporates to form microstructures that can entrap or restrict reaction intermediates; also, the reaction intermediates formed by the organic amine halide salt and inorganic metal halide molecules slowly approach the saturated solubility owning to the evaporation of the organic solvent, and with the further evaporation of the organic solvent, the reaction intermediates reach the nucleation critical concentration of the nanomaterial and quickly start nucleating, when the inorganic metal cations and the halogen anions form a coordinated octahedron and the organic amine cations enter the interstices among adjacent octahedrons to form a perovskite structure. Because of the hydrogen bonding present between the organic amine halide salt and inorganic metal halide molecules, they will soon start self-assembling, with the inorganic metal cation and halogen anion forming a coordinated octahedron and the organic amine cation entering the interstices among adjacent octahedrons to form a hybrid perovskite structure. However, because the microstructures formed by the matrix has a limitation effect on the crystal nucleus growth, the diffusion of the reaction intermediates in the matrix is limited, which limits the growth of the particle in three-dimensional directions and thus limits the size of the perovskite particle to a nanoscale level. In other words, due to the evaporation of the organic solvent, the mobility of the polymer chains tends to be restricted and they will cover the surface of the formed perovskite particles, limiting the growth of the particles in three-dimensional directions.

In one aspect of the present invention, the present invention proposes a perovskite/polymer composite luminescent material. According to an example of the present invention, with reference to FIG. 1, the composite luminescent material is composed of perovskite nanoparticles in which the perovskite nanoparticles 1 are uniformly dispersed in the matrix 2. It is noteworthy that, in the present invention, the perovskite nanoparticles should be acknowledged in a broad sense. In the present invention, the perovskite nanoparticles may be either quantum dots or nanosheets, or nanowires, provided that the size of the perovskite particles in at least one dimension does not exceed 10 nm. That is, in the present invention, the perovskite nanoparticles may be quantum dots with a particle diameter of no more than 10 nm, nanowires with a diameter of no more than 10 nm, or nanosheets with a thickness of no more than 10 nm. Here, the mass ratio of perovskite nanoparticles to the matrix is 1:(1 to 50). The composite material has at least one of the advantages including high fluorescence quantum yield, high photoluminescence efficiency, high transparency, and low production cost.

According to an example of the present invention, in order to further improve the performance of the composite luminescent material, the performance of the composite luminescent material can be controlled by adjusting the mass ratio of the perovskite nanoparticles to the matrix in the composite luminescent material. In particular, according to an example of the present invention, the mass ratio of perovskite nanoparticles to the matrix may also be 1:(2 to 50); according to other examples of the present invention, the mass ratio of the perovskite nanoparticles to the matrix can also be: 1:(5 to 50). Thus, the photoluminescence performance of the composite luminescent material can be further improved.

According to an example of the present invention, the matrix is a polymer. For example, the polymer may be selected from at least one of polyvinylidene fluoride (PVDF), copolymers of polyvinylidene fluoride and trifluoroethylene (P(VDF-TrFE)), polyacrylonitrile (PAN), polyvinyl acetate (PVAc) Cellulose acetate (CA), cyano cellulose (CNA), polysulfone (PSF), aromatic polyamide (PA), polyimide (PI), polycarbonate (PC), polystyrene (PS), and these polymers are chosen for the matrix because: the above polymers have the same organic solvent system with the reaction raw materials for perovskite nanoparticles, the polymer matrices themselves are transparent, and the polymer matrices themselves have excellent water and oxygen resistance, piezoelectric properties, dielectric properties, and mechanical properties. Specifically, since PVDF and P(VDF-TrFE) have the strongest electronegativity per unit carbon atom as well as excellent piezoelectric properties and mechanical properties of their own, they are general used as the primary matrix to form a matrix in association with other polymer matrices, so as to obtain composite luminescent materials with much superior properties.

According to an example of the present invention, the perovskite nanoparticles comprise a core with the formula of $CsAB_3$ or $R_1NH_3AB_3$ or $(R_2NH_3)_2AB_4$. Here, A and B form a coordinated octahedral structure, with $R_1NH_3$ or $R_2NH_3$ filling the interstices of the coordinated octahedrons formed by A and B. According to an example of the present invention, A is at least one selected from Ge, Sn, Pb, Sb, Bi, Cu or Mn, and B is at least one selected from Cl, Br and I. According to an example of the present invention, $R_1$ is methyl, and $R_2$ can be an organic group. Specifically, according to an example of the present invention, $R_2$ can be ethyl, a saturated or unsaturated alkyl group with no less than 4 carbon atoms, or an aromatic group. For example, according to a particular embodiment of the present invention, $R_2$ can be a saturated or unsaturated alkyl group with 4 to 24 carbon atoms. Thus, depending on the metal element and halogen that practically form the perovskite nanoparticle and the size of the interstices in the octahedrons constituting the cores, a suitable organic amine with an $R_1$ or $R_2$ group may be chosen to be filled therein so as improve the luminous efficiency and stability of the perovskite nanoparticle components in the examples of the present invention, and emission wavelength can be adjusted by choosing the components that form the perovskite nanoparticles and morphology thereof.

According to an example of the present invention, surface ligands may be distributed on the surface of part of the perovskite nanoparticles. That is, the perovskite nanoparticles may further comprise surface ligands which are formed on the surface of the core. According to an example of the present invention, the surface ligand may be an organic acid or a long chain organic amine, and the surface ligand envelops the surface of the perovskite nanoparticles in a radial manner. Organic acids or amines can be adsorbed on the surface of perovskite nanoparticles core via Van Der Waal's force, in order to effect further limitation to the perovskite nanoparticles, including restriction to the in situ growth of the perovskite nanoparticles and the movement of the formed perovskite nanoparticles in the matrix. Thus, the stability of the perovskite nanoparticles can be further improved, and the properties of the composite material can be improved. Further, by adding an organic acid or an organic amine, the morphology of perovskite nanoparticles can be managed such that granular, flaky or wire-like perovskite nanoparticles are formed.

In particular, the organic acid that constitutes the surface ligand may be a saturated alkyl acid or an unsaturated alkyl acid with at least 3 carbon atoms, according to some examples of the present invention, the organic acid may be a saturated alkyl acid with a general formula of $C_nH_{2n+1}COOH$ (n ≥ 2), or an unsaturated alkyl acid with a general formula of $C_nH_{2n-1}COOH$ (n ≥ 2). For example, the organic acid may be an organic acid having a formula in accordance with the above general formula with 3 to 24 carbon atoms; the long chain organic amine that constitutes the surface ligand may have a molecular formula of $RNH_2$, wherein R is a saturated linear alkyl group or a saturated branched alkyl group, or an unsaturated linear alkyl group or an unsaturated branched alkyl group, and more specifically, R may be an alkyl or aromatic group with 4 to 24 carbon atoms.

According to an example of the present invention, the composite luminescent material may further comprise an additive. Specifically, the additive may be at least one of silica, boron nitride nanosheets, graphene, and carbon nanotubes. Thus, the composite material may be provided with a reasonable structure, so that the composite material can have superior performance. In particular, by adding silica or boron nitride nanosheets, a network structure can be formed in the matrix, thereby inhibiting the mobile state of the polymer molecular chains, and especially for the polymer matrix whose molecular chains are mobile at room temperature, the stability of the perovskite nanoparticles in the polymer matrix can be further ensured by adding the above additive. The thermal conductivity of the polymer matrix can be further enhanced by adding the thermally and electrically conductive carbon nanomaterials like graphene or carbon nanotubes, and thereby further improving the thermal stability of perovskite nanoparticle-based composite materials.

In another aspect of the present invention, the present invention proposes a perovskite/polymer composite luminescent material.

The perovskite/polymer composite luminescent material proposed in the present invention comprises two parts, perovskite and polymer. The perovskite particles were embedded in the interspaces among the polymer molecules, as shown in FIG. 1 in which 1 is the perovskite particles and 2 is the polymer chain, with a mass ratio of the perovskite particles to the polymer as perovskite:polymer=1:(1 to 50). The formula of the perovskite is $R_1NH_3AB_3$ or $(R_2NH_3)_2AB_4$ in which A and B form a coordinated octahedral structure, with $R_1NH_3$ or $R_2NH_3$ filling the interstices of the coordinated octahedrons formed by A and B, wherein $R_1$ is methyl, $R_2$ is an organic group, A is any one of the metal Ge, Sn, Pb, Sb, Bi, Cu or Mn, and B is any one of Cl, Br, I. The polymer is any one of polyvinylidene fluoride (PVDF), polyvinyl acetate (PVAc), cellulose acetate (CA), polysulfone (PSF), aromatic polyamide (PA), polyimide (PI), polycarbonate (PC), and polystyrene (PS).

In another aspect of the present invention, the present invention provides a method for preparing the composite luminescent material. According to an example of the present invention, the method comprises:

(1) Obtaining the First Solution

According to an example of the present invention, in this step, the matrix is dissolved in the first organic solvent to obtain the first solution.

In particular, the first organic solvent comprises at least one selected from N,N-dimethylformamide (DMF), dimethylsulfoxide (DMSO), trimethylphosphate (TMP), triethyl phosphate (TEP), N-methylpyrrolidone (NMP), and dimethylacetamide (DMAc). The first organic solvent composed of the above-mentioned polymers has not only good compatibility with the matrix, but also allows the matrix, the additive, the inorganic metal halide, the organic amine halide, and the surface ligand to be uniformly dissolved in a solvent system. According to an example of the present invention, the matrix is composed of polymers which can be at least one of polyvinylidene fluoride (PVDF), copolymer of polyvinylidene fluoride and trifluoroethylene (P(VDF-TrFE)), polyacrylonitrile PAN), polyvinyl acetate (PVAc), cellulose acetate (CA), cyano cellulose (CNA), polysulfone (PSF), aromatic polyamide (PA), polyimide (PI), polycarbonate (PC), and polystyrene (PS). Thus, uniform dispersion of the perovskite nanomaterials in the polymer can be achieved through the interaction between electronegative groups on the polymer chains and positively charged ions in the perovskite component. Moreover, the polymer matrix has a limiting effect on the perovskite nanoparticles, including restriction to the in situ growth of the perovskite nanoparticles and the movement of the formed perovskite nanoparticles in the matrix. Furthermore, the polymers can also serve as a transparent substrate for the perovskite nanoparticles to improve the performance of the composite material eventually prepared. The mass ratio of the matrix to the first organic solvent can be 1:(1 to 50). Thus, a first solution with an appropriate matrix content can be obtained, so that the limitation effect of the matrix on the size of the perovskite nanoparticles can be further improved. According to other examples of the present invention, the mass ratio of the matrix to the first organic solvent can also be 1:(2 to 50); alternatively, the mass ratio of the matrix to the first organic solvent is 1:(5 to 50). Thus, a first solution with an appropriate matrix content can be obtained, so that the limitation effect of the matrix on the size of the perovskite nanoparticles can be further improved.

According to an example of the present invention, in this step, the first solution may further comprise an additive. According to an example of the present invention, the additive comprises at least one of silica, boron nitride nanosheets, graphene, and carbon nanotubes, and the mass ratio of the matrix to the additive can be 1:(0.01 to 0.5). Thus, the size of the perovskite nanoparticles can be further defined by the above-mentioned additives, providing a reasonable structure for the composite material, and the additive comprised of the above nanomaterials can further improve the electrical, mechanical and other physical and chemical properties of the composite luminescent material. The effect of the additive on the composite luminescent material prepared by this method has the same characteristics and advantages as those described above in the composite luminescent material, and will not be described in details here.

According to an example of the present invention, the preparation process of the first solution can be carried out by employing a high-speed disperser. Thus, the uniformity and dispersibility of the first solution can be further improved, and thereby the performance of the composite material can be improved. Specifically, the first solution can be prepared by the following steps: dissolving the matrix in a first organic solvent, with a mass ratio of the matrix to the first organic solvent of 1:(1 to 50), mechanical stirring and mixing for 12 h so that the matrix is completely dissolved to obtain a transparent mixed solution, adding an additive to the transparent mixed solution, with the mass ratio of the matrix to the additive controlled at 1:(0.01 to 0.5), and mechanical stirring and mixing for 1 to 3 h to mix uniformly and obtain the first solution. Thus, the performance of the composite luminescent material prepared by the method can be further improved.

(2) Obtaining the Second Solution

According to an example of the present invention, in this step, the inorganic metal halide and the organic amine halide are dissolved in a second organic solvent to obtain the second solution. According to an example of the present invention, the second organic solvent comprises at least one selected from DMF, DMSO, TMP, TEP, NMP, and DMAc, and the second organic solvent is miscible with the first organic solvent. It is to be noted that, in the present invention, the term "miscible" means that phase separation does not occur in the mixed solution when the first organic solvent is mixed with the second organic solvent. Thus, the first solution and the second solution can be mixed to form a uniform organic solvent system, that is, the solubility of the inorganic metal halide, the organic amine halide, the surface ligand, polymer matrix, additive and other raw materials components dissolved in the first solution and second solution is not significant different in the first organic solvent and in the second organic solvent, and there is no phase separation in both macro- and microstructures. Here, the molar ratio of the inorganic metal halide to the organic amine halide can be 1:(0.1 to 3), and the mass ratio of the second organic solvent to the inorganic metal halide can be 1:(0.01 to 0.1). According to the other examples of the present invention, the ratio between the mass of the second organic solvent to the overall mass of the inorganic metal halide and the organic amine halide salt or the cesium halide can also be controlled as 1:(0.01 to 0.1). Thus, the ratio of the inorganic metal halide to the organic amine halide salt can be controlled within a relatively appropriate range, so that the properties of the formed perovskite nanoparticles can be improved. According to an example of the present invention, the inorganic metal halide may be at least one of the halide salts of Ge, Sn, Pb, Sb, Bi, Cu, and Mn; the general formula of the organic amine halide can be $RNH_3B$, and the general formula of cesium halide can be $CsB$, wherein R is a saturated alkyl group, an unsaturated alkyl group or an aromatic group, wherein the saturated alkyl group may be methyl, ethyl, or a long chain saturated alkyl group with more than 4 carbon atoms; B is selected from at least one of Cl, Br or I. Thus, perovskite nanoparticles with good photoluminescence properties can be formed. It will be understood by those skilled in the art that the inorganic metal halide and the organic amine halide or cesium halide will form the core of the perovskite nanoparticles in subsequent steps, and therefore the specific types of the inorganic metal halide and the organic amine halide may be chosen according to the type of the perovskite nanoparticles practically needed. The various parts of the perovskite nanoparticles core thus formed and criterion of selection therefor have been described in details hereinabove, and will not be repeated here.

In particular, the second solution can be prepared by the following steps: mixing the inorganic metal halide with the organic amine halide or a cesium halide powder while controlling the molar ratio of the inorganic metal halide to the organic amine halide or cesium halide as 1:(0.1 to 3), adding the second organic solvent and controlling the mass ratio of the second organic solvent to the inorganic metal halide as 1:(0.01 to 0.1) or the ratio of the mass of the second organic solvent to the overall mass of the inorganic metal halide and the organic amine halide salt or cesium halide as 1:(0.01 to 0.1), mixing and conducting ultrasonic treatment for 15 minutes to obtain a transparent mixed solution, filtering the transparent mixed solution upon ultrasonic treatment, and using the resultant filtrate as the second solution.

(3) Forming the Precursor Solution

According to an example of the present invention, in this step, the first solution is mixed with the second solution to obtain the precursor solution. Specifically, the mass ratio of the first solution to the second solution can be 1:(0.02 to 1). Thus, the performance of the composite luminescent material obtained by the method can be further improved.

According to an example of the present invention, in order to further improve the performance of the composite luminescent material obtained by the method, the method may further comprise the following steps according to an example of the present invention.

A surface ligand is added to the precursor solution (also referred to as an organic ligand in the present invention). According to an example of the present invention, specifically, the surface ligand is an organic acid or a long chain organic amine, and the mass ratio of the second solution to the surface ligand is 1:(0.001 to 0.3) in the precursor solution. Thus, the perovskite nanoparticles in the composite material can be provided with organic hybrid groups, improving the structure of the perovskite nanoparticles, and thereby improving the performance of the composite. According to an example of the present invention, the surface ligand may be an organic acid or a long chain organic amine in the perovskite nanoparticle component of the composite material. The long organic acid or amine can be adsorbed on the surface of perovskite nanoparticles core via Van Der Waal's force, which can effect further limitation to the perovskite nanoparticles, including restriction to the in situ growth of the perovskite nanoparticles and the movement of the formed perovskite nanoparticles in the matrix. Thus, the stability of the perovskite nanoparticles can be further improved, and thereby the performance of the composites can be improved. Specifically, the organic acid may include a saturated or unsaturated alkyl acid with at least three carbon atoms; the long chain organic amine may be an alkyl or aromatic amine with 4-24 carbon atoms. It is to be noted that the above organic acid or long-chain organic amine may have the same characteristics and advantages as those surface ligands in the composite luminescent material described above and will not be described in details here.

According to an example of the present invention, the precursor solution can also be obtained by the following steps: mixing the first solution with the second solution, with a mass ratio of the first solution to the second solution of 1:(0.02 to 1), adding the surface ligand with a mass ratio of the second solution to the surface ligand of 1:(0.001 to 0.3), and mechanical stirring for 2 h to obtain the precursor solution mixed with the surface ligand. Thus, the performance of the composite luminescent material prepared by the method can be further improved.

(4) Transfering

According to an example of the present invention, in this step, the homogeneous precursor solution is transferred to the template by using a suitable method, so as to form the composite materials of different shapes. Here, the template may be a mold or a substrate with specific shapes. As for specific cases of templates, those skilled in the art are capable of designing the shapes of the composite luminescent material according to the specific requirements in practical application. Specifically, the methods of transferring the precursor solution onto the substrate or the mold may include a spin coating method, a dip coating method, an electrospinning method, a solution depositing method, a spray coating method, a blade coating method or a casting method. Thus, the composite luminescent material with film and other shapes can be readily obtained.

(5) Drying

According to an example of the present invention, in this step, the template with the precursor solution is dried to obtain the composite luminescent material. Specifically, the template applied with precursor solution can be placed in a vacuum drying oven, and the organic solvent in the precursor solution is removed under certain conditions. Thus, the evaporation conditions of the organic solvent system can be manipulated to control the matrix crystallization, arrangement of the additive, nucleation and growth of the perovskite nanoparticles, in order to improve the performance of the composite materials. For example, according to a particular example of the present invention, the air pressure in the vacuum drying oven can be between 0.01 and 0.1 MPa, the temperature can be between 20 and 110° C., and drying is conducted for 0.5 to 48 h to obtain a perovskite nanoparticle-based composite material with a thickness of 0.001 to 5 mm.

In another aspect of the present invention, the present invention provides a method for preparing the perovskite/polymer composite luminescent material described above. Specifically, the method of the present invention for preparing the perovskite/polymer composite luminescent material comprises the following steps:

(1) dissolving the polymer in an organic solvent while controlling the mass ratio of the polymer to the organic solvent as 1:(1 to 50), and ultrasonic mixing for 12 hours; after the polymer was completely dissolved, adding an additive to the obtained homogeneous viscous polymer solution while controlling the mass ratio as: the polymer:the additive=1:(0 to 0.5), ultrasonic mixing for 1-3 hours to mix uniformly and obtain the first solution; wherein, the organic solvent is any one of N,N-dimethylformamide (DMF), dimethylsulfoxide (DMSO), trimethylphosphate (TMP), triethyl phosphate (TEP), N-methylpyrrolidone (NMP) or dimethylacetamide (DMAc), and the additive is any one of polyvinylpyrrolidone (PVP) or polyethylene glycol (PEG);

(2) mixing the inorganic halide salt and the organic amine halide powder while controlling the molar ratio of the inorganic halide salt:the organic amine halide salt=1:(0.1-3), adding the organic solvent while controlling the mass ratio of the organic solvent:the inorganic halide salt=1:(0.01 to 0.1), mixing and conducting ultrasonic treatment for 15 minutes to obtain a transparent mixed solution, filtering the mixed solution upon ultrasonic treatment, and using the filtrate as the second solution; wherein, the inorganic halide salt is any one of the halide salt of metal Ge, Sn, Pb, Sb, Bi, Cu, and Mn, the organic solvent is any one of N,N-Dimethylformamide (DMF), dimethylsulfoxide (DMSO), trimethylphosphate (TMP), triethyl phosphate (TEP), N-methylpyrrolidone (NMP), and dimethylacetamide (DMAc), and the organic amine halide salt is a saturated alkylamine halide salt with a general formula of $C_nH_{2n+1}NB_3$ (n⩾ 1, B is any one of Cl, Br, and I) or an unsaturated alkylamine halide salt or an aromatic amine halide salt with a formula of $C_nH_{2n-1}NB_3$ in which n⩾ 2, B is any of Cl, Br, I;

(3) mixing the first solution from step (1) with the second solution from step (2) while controlling the volume ratio of the first solution:the second solution=1:(0.02 to 1), and ultrasonic mixing for 2 h to obtain the mixed precursor solution;

(4) transferring the precursor solution described in the above step (3) to a transparent substrate or mold through a spin coating method, a dip coating method, an electrospinning method, a solution depositing method, a spray coating method or a casting method so that the precursor solution is uniformly dispersed and the thickness thereof on the transparent substrate or mold is controlled at 0.001 to 5 mm, and then placing the substrate or mold coated with the precursor solution in a vacuum drying oven at a pressure of 0.01 to 0.1 MPa and a temperature of 30 to 70° C., and dryings for 0.5 to 48 h to remove the organic solvent to obtain the perovskite/polymer composite luminescent material.

In the preparation method of the present invention, the perovskite/polymer composite luminescent materials with different emission wavelengths can be prepared by adjusting the species and proportion of the perovskite raw materials; and by varying the types of the polymer, the solvent and the additive, perovskite/polymer composite luminescent materials with different particle sizes can be prepared.

In another aspect of the present invention, the present invention proposes a semiconductor device. According to an example of the present invention, the semiconductor device contains the composite luminescent material described above. Thus, the above-mentioned polymer-containing composite luminescent material can be used directly as a related structure in a semiconductor device, so that the manufacturing process of the semiconductor device can be simplified, the production cost can be reduced, and the performance of the semiconductor device can be guaranteed as well.

According to an example of the present invention, the semiconductor device is an electroluminescent device, a photoluminescent device, a solar cell, a display device, a sensing device, a piezoelectric device, or a nonlinear optical device. Thus, the performance of the above-mentioned semiconductor device can be further improved. According to other examples of the present invention, the semiconductor device may also be a flexible device. Thus, the performance of the above-mentioned semiconductor device can be further improved.

Figure 2:
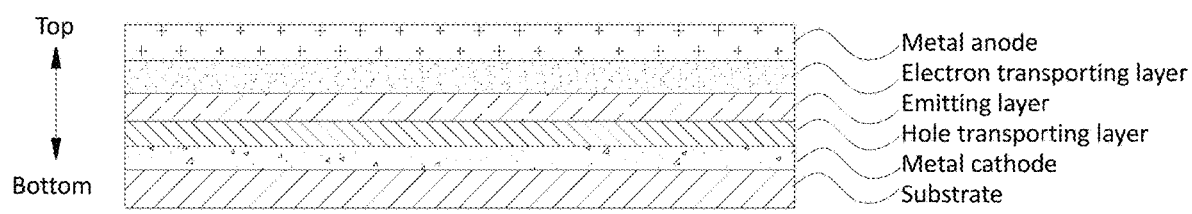
FIG. 2 is a schematic diagram of the structure of the flexible electroluminescent device according to an example of the present invention.

According to an example of the present invention, the semiconductor device may be a flexible device, as shown in FIG. 2, the composite luminescent material may be a thin film and used directly to form the flexible transparent substrate in the electroluminescent device; according to other examples of the present invention, the flexible device may further have a light-emitting layer composed of electroluminescent materials, which combine the photoluminescent properties of the perovskite nanoparticles and light emission by electroluminescence so as to further improve the light-emitting performance of the flexible device. It will be understood by those skilled in the art that the flexible device may further include structures for effecting its device performance, such as a metal cathode, a metal anode, an electron transporting layer, an hole transporting layer, as illustrated in FIG. 2, and will not be described in details here.

Figure 3:
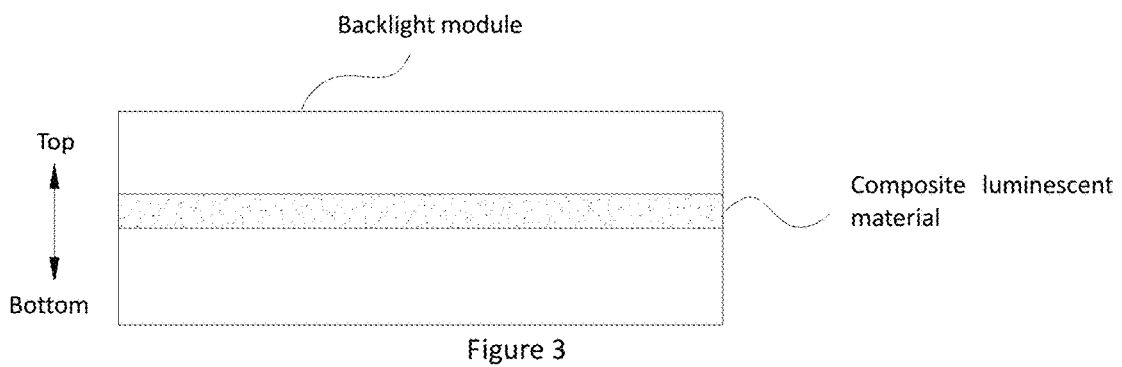
FIG. 3 is a schematic diagram of the structure of the LCD display backlight module according to an example of the present invention.

According to an example of the present invention, the above-described composite luminescent material can also be applied to an LCD display device. Specifically, referring to FIG. 3, the composite luminescent material as described above can be prepared as a thin film, and inserted among the multilayer film structures of an LCD backlight module, or the composite luminescent material can be directly coated on the upper surface or the lower surface of the light guide plate, diffusion film or the prism film in the LCD backlight module, so that a high color gamut LCD backlight module can be achieved by using the blue light LED as light source.

Figure 4:
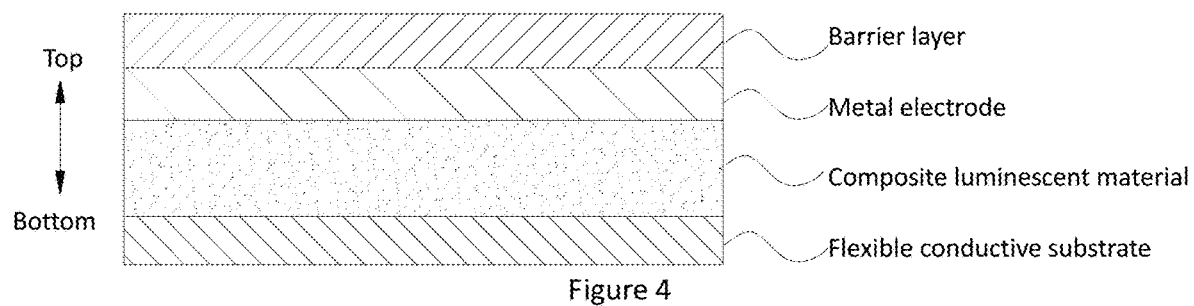
FIG. 4 is a schematic diagram of the structure of the piezoelectric device according to an example of the present invention.

According to an example of the present invention, when the above-mentioned semiconductor device is a piezoelectric device, referring to FIG. 4, a perovskite particles/polymer composite luminescent material with piezoelectric characteristics can be employed, and with a reasonable electrical structure design, such as the metal electrode, shield layer, conductive flexible substrate, circuit (not shown in the figure) and other structures, the potential difference generated by external actions can be derived, so that the multi-functional semiconductor device with various functions such as piezoelectricity and sensing can be realized.

The present invention will be described below by specific examples, and it shall be noted that the following specific examples are merely for illustrative purpose and not limiting to the scope of the present invention by any means. In addition, unless specifically stated, methods without specific conditions or steps indicated are conventional methods, and the reagents and materials used are all commercially available.

Example 1

(1) The polymer was dissolved in organic solvent, with the mass ratio controlled as: polymer:organic solvent=1:5, and ultrasonic mixed for 12 hours; after the polymer was completely dissolved, a homogeneous viscous polymer solution was obtained, and ultrasonic mixed for 1 h to mix uniformly and obtain a solution as the first solution. The polymer is polyvinyl acetate (PVAc); the organic solvent was N,N-dimethylformamide (DMF).

(2) The inorganic metal halide was mixed with the organic amine halide powder, while controlling the molar ratio as: inorganic metal halide:organic amine halide=1:1, and then the organic solvent was added, and controlling the mass ratio as: organic solvent:inorganic metal halide=1:0.01; after mixing, ultrasonic treatment was carried out for 15 minutes to obtain a transparent mixed solution, and the transparent mixed solution upon ultrasonic treatment was filtered to obtain a filtrate as the second solution. In this step, the organic metal halide was metal $PbI_2$; the organic solvent was N,N-dimethylformamide (DMF); and the organic amine halide was $CH_3NH_3I$.

(3) The first solution in step (1) was mixed with the second solution in step (2), while controlling the mass ratio as: the first solution:the second solution=1:0.02, and ultrasonicated for 2 h to obtain a homogeneous precursor solution.

(4) The precursor solution in the above step (3) was transferred to a transparent glass sheet by a spin coating method to achieve uniform dispersion, with the thickness of the precursor solution on the transparent glass sheet controlled at 0.01 mm; the transparent glass sheet coated with the precursor solution was placed in a vacuum drying oven at the air pressure of 0.01 MPa and the temperature of 30°

Figure 5:
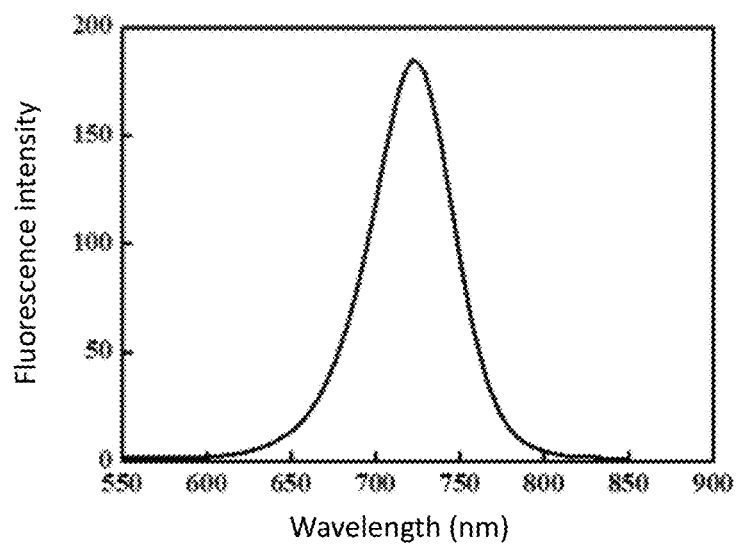
FIG. 5 is a fluorescence emission spectrum of the $CH_3NH_3PbI_3$/PVAc composite material in Example 1 of the present invention.

C., dried for 48 h to remove the organic solvent and obtain a $CH_3NH_3PbI_3$ quantum dot/PVAc composite film in brown color which could be removed from the glass sheet, and the composite film emitted rosy red light in the light of a UV lamp at 365 nm. The emission of the composite film measured by a fluorescence spectrometer was in the near infrared region, with an emission peak position at 726 nm. FIG. 5 shows the fluorescence emission spectrum of the obtained $CH_3NH_3PbI_3$ quantum dot/PVAc composite thin film.

Example 2

The procedures were the same as in Example 1 except for the following: in the first solution, the mass ratio of the polymer to the organic solvent was controlled as 1:50, and in the second solution, the mass ratio of the organic solvent: (inorganic metal halide+organic amine halide) was controlled as 1:0.02; ultrasonic mixing was changed to mixing by mechanically stirring the solution, and the temperature of vacuum drying oven was set at 80° C.; and a $CH_3NH_3PbI_3$ quantum dot/PVAc composite thin film was obtained.

Example 3

The procedures were the same as in Example 1 except for the following: in the first solution, the polymer was cellulose acetate (CA), and the organic solvent was dimethylsulfoxide (DMSO), with a mass ratio of polymer:organic solvent=1: 10; the additive polyvinylpyrrolidone (PVP) was added, with the mass percentage concentration ratio of polymer solution:additive controlled at 1:0.1, and ultrasonic mixed for 12 hours; in the second organic solvent, the organic solvent was dimethylsulfoxide (DMSO), the organic amine halide was $CH_3NH_3Cl$, and the inorganic metal halide was $PbCl_2$, with the molar ratio of inorganic metal halide:organic amine halide controlled at 1:1.5, and the mass ratio of organic solvent:inorganic metal halide controlled at 1:0.02; in the precursor solution, the volume ratio of the first solution:the second solution was controlled at 1:0.3; the precursor solution was transferred to a transparent glass sheet by a dip coating method, with the thickness of the precursor solution on the transparent glass sheet controlled at 0.5 mm; under the air pressure in the vacuum drying oven at 0.02 MPa and at 40° C., drying was carried out for 40 h to obtain a $CH_3NH_3PbCl_3$ quantum dot/CA composite film in light blue color which could be removed from the glass sheet, and the composite film emitted light blue light in the light of a UV lamp at 365 nm; the emission peak of the composite film was positioned at 490 nm as measured by a fluorescence spectrometer.

Example 4

The procedures were the same as in Example 3 except that the mass ratio of the organic solvent:(inorganic metal halide+organic amine halide) was controlled at 1:(0.02) in the second solution and ultrasonic mixing in step (3) was changed to mechanical stirring for 2 h followed by dispersing for 5 minutes with high-speed disperser, and a $CH_3NH_3PbCl_3$ quantum dot/CA composite thin film was obtained.

Example 5

Figure 6:
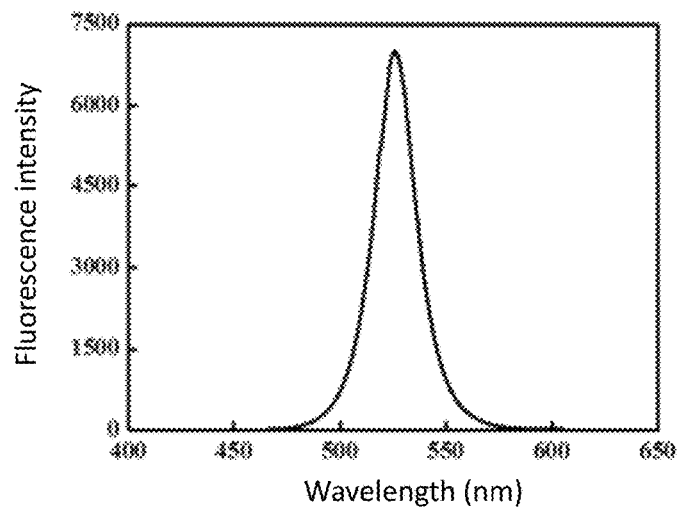
FIG. 6 is a fluorescence emission spectrum of the $CH_3NH_3PbBr_3$/PVDF composite thin film according to Example 5 of the present invention.
Figure 7:
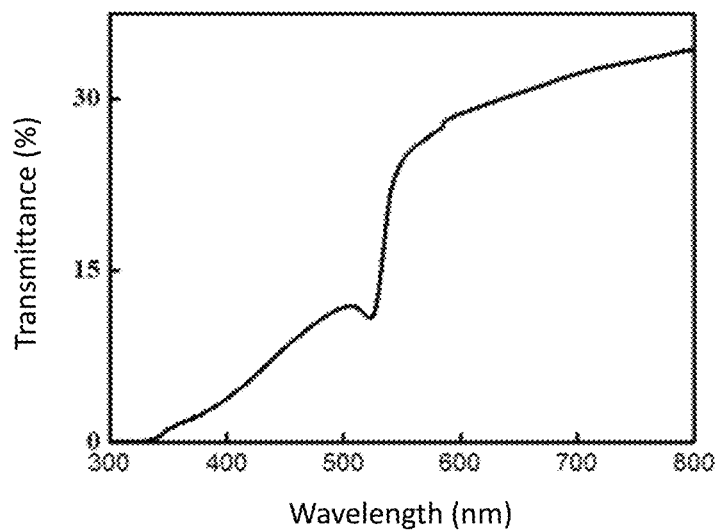
FIG. 7 is a transmittance spectrum within the visible region of the $CH_3NH_3PbBr_3$/PVDF composite material in Example 5 of the present invention.

The procedures were the same as in Example 1 except for the following: in the first solution, the polymer was polyvinylidene fluoride (PVDF), and the organic solvent was trimethyl phosphate (TMP), with the mass ratio of polymer: organic solvent controlled at 1:20; in the second solution, the inorganic metal halide was $PbBr_2$, the organic solvent was trimethyl phosphate (TMP), and the organic amine halide was $CH_3NH_3Br$, with the molar ratio of inorganic metal halide:organic amine halide controlled at 1:0.5, and the mass ratio of organic solvent:inorganic metal halide controlled at 1:0.03; in the precursor solution, the volume ratio of the first solution:the second solution was controlled at 1:0.04; the precursor solution was transferred to a glass culture dish by a solution depositing method, with the thickness of the precursor solution on the transparent glass culture dish controlled at 1 mm; under the air pressure in the vacuum drying oven at 0.03 MPa and at 50° C., drying was carried out for 5 h to obtain a $CH_3NH_3PbBr_3$ quantum dot/PVDF composite film in dark green color which could be removed from the glass culture dish, and the composite film emitted green light in the light of a UV lamp at 365 nm; the emission peak of the composite film was positioned at 515 nm as measured by a fluorescence spectrometer. FIG. 6 is the fluorescence emission spectrum of the obtained $CH_3NH_3PbBr_3$ quantum dot/PVDF composite thin film, and FIG. 7 is the transmittance spectrum of the composite thin film.

Example 6

Figure 13:
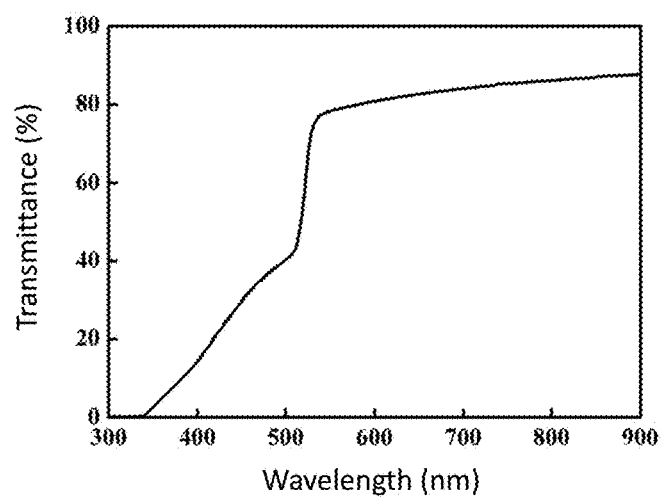
FIG. 13 is a light transmittance spectrum of the $CH_3NH_3PbBr_3$ quantum dot/PVDF composite thin film in Example 31 of the present invention.

The procedures were the same as in Example 1 except for the following: in the first solution, the polymer was polyvinylidene fluoride (PVDF), the additive was silica, and the organic solvent was trimethyl phosphate (TMP), with the mass ratio of polymer:organic solvent controlled at 1:20; the mixing was carried out for 12 h, and the additive was added while controlling the mass percentage concentration of the polyer solution:additive at 1:0.2, followed by mixing under mechanical stirring for 3 h to mix uniformly; in the second solution, the inorganic metal halide was lead bromide, the organic solvent was trimethyl phosphate (TMP), and the organic amine halide was $CH_3NH_3Br$, with the molar ratio of inorganic metal halide:organic amine halide controlled at 1:0.5, and the mass ratio of organic solvent:(inorganic metal halide+organic amine halide) controlled at 1:0.03; in the precursor solution, the volume ratio of the first solution:the second solution was controlled at 1:0.04, and mechanical stirring was conducted for 2 h; the precursor solution was transferred to a glass culture dish by a solution depositing method, with the thickness of the precursor solution on the transparent glass culture dish controlled at 1 mm; under the air pressure in the vacuum drying oven at 0.03 MPa and at 50° C., drying was carried out for 5 h to obtain a $CH_3NH_3PbBr_3$ quantum dot/PVDF composite film in dark green color which could be removed from the glass culture dish, and the composite film emitted green light in the light of a UV lamp at 365 nm; the emission peak of the composite film was positioned at 515 nm as measured by a fluorescence spectrometer. FIG. 13 is the transmittance spectrum of the composite thin film.

The silica material used in the present embodiment is a network-like silica, which was synthesized according to the method disclosed in the invention patent with patent number of 201410177799.1 entitled "Preparation method for a nanocrystal-doped optical glass" and could also be provided by Beijing Institute of Technology.

Example 7

The procedures were the same as in Example 7 except for the following: in the first solution, the mass ratio of polymer:

organic solvent was controlled at 1:30; the mixing was carried out for 12 h under magnetic stirring, and the additive was added while controlling the mass percentage concentration of the polymer solution:additive at 1:0.2, followed by mixing under magnetic stirring for 3 h, wherein the polymer was polysulfone (PSF), the additive was polyethylene glycol (PEG), and the organic solvent was triethyl phosphate (TEP); in the second solution, the molar ratio of inorganic metal halide:organic amine halide was controlled at 1:2, and the mass ratio of organic solvent:inorganic metal halide was controlled at 1:0.04, wherein the inorganic metal halide was $GeI_2$, the organic solvent was triethyl phosphate (TEP), and the organic amine halide was ethylamine bromide; in the precursor solution, the volume ratio of the first solution:the second solution was controlled at 1:0.1, and magnetic stirring was conducted for 2 h; the precursor solution was transferred to a transparent PMMA sheet by an electrospinning method, with the thickness of the precursor solution on the transparent PMMA sheet controlled at 0.15 mm; under the air pressure in the vacuum drying oven at 0.04 MPa and at 60° C., drying was carried out for 10 h to remove the organic solvent, so as obtain a $(C_2H_5NH_3)_2GeI_4$ quantum dot/PSF composite material in dark green color attached to the transparent PMMA sheet, with emission in the infrared region.

Example 8

The procedures were the same as in Example 7 except for the following: in the first solution, the mass percentage concentration of polymer solution:additive was controlled at 1:0.3; in the second solution, the mass ratio of the organic solvent:(inorganic metal halide+organic amine halide) was controlled at 1:0.04; during the transferring of the precursor solution, the thickness of the precursor solution on the transparent PMMA sheet was controlled at 0.001 mm. A $(C_2H_5NH_3)_2GeI_4$ quantum dot/PSF composite material attached to the transparent PMMA sheet was obtained.

Example 9

The procedures were the same as in Example 1 except for the following: in the first solution, the polymer was polyvinylidene fluoride (PVDF), and the organic solvent was N,N-dimethylformamide (DMF), with a mass ratio of polymer:organic solvent=1:40; in the second solution, the organic solvent was N,N-dimethylformamide (DMF), and the organic amine halide was methylamine chloride, with the molar ratio of inorganic metal halide:organic amine halide controlled at 1:2.5, and the mass ratio of organic solvent: inorganic metal halide controlled at 1:0.05; in the precursor solution, the volume ratio of the first solution: the second solution was controlled at 1:0.06; the precursor solution was transferred to a transparent polycarbonate (PC) sheet by a spray coating method, with the thickness of the precursor solution on the transparent polycarbonate (PC) sheet controlled at 2 mm; under the air pressure in the vacuum drying oven at 0.05 MPa and at 70° C., drying was carried out for 20 h to obtain a $CH_3NH_3PbCl_xBr_{3-x}(0 \leq x \leq 3)$ quantum dot/CA composite film in bluish green color attached to the transparent polycarbonate (PC) sheet, which appeared in bluish green in the light of a UV lamp.

Example 10

(1) The polymer was dissolved in an organic solvent, with the mass ratio controlled as: polymer:organic solvent=1:40, and mixed under mechanical stirring for 12 h; after the polymer was completely dissolved, a homogeneous viscous polymer solution was obtained, and an additive was added to the above-mentioned polymer solution while controlling the mass percentage concentration as: polymer solution: additive=1:0.4, and mixed under mechanical stirring for 3 h to mix uniformly and obtain a solution as the first solution. The polymer was a mixture of polyvinylidene fluoride (PVDF) and polyacrylonitrile (PAN) with mass ratio of 1:1, the additive was carbon nanotubes soluble in DMF, and the organic solvent was N,N-dimethylformamide (DMF).

(2) The inorganic metal halide was mixed with the organic amine halide powder, while controlling the molar ratio as: inorganic metal halide:organic amine halide=1:2.5, and then the organic solvent was added while controlling the mass ratio as: organic solvent:(inorganic metal halide+organic amine halide powder)=1:0.01; after mixing, ultrasonic treatment was carried out for 15 minutes to obtain a transparent mixed solution, and the transparent mixed solution upon ultrasonic treatment was filtered to obtain a filtrate as the second solution. In this step, the organic metal halide was lead bromide; the organic solvent was N,N-dimethylformamide (DMF), and the organic amine halide was $CH=NHNH_3Cl$.

(3) The first solution in step (1) was mixed with the second solution in step (2), while controlling the volume ratio of the first solution:the second solution=1:0.12. N,N'-diphenyl-1,4-phenylenediamine was added as the organic ligand, with a mass ratio of the second solution to the organic ligand of 1:0.01, and mechanical stirring was carried out for 2 h followed by stirring with high-speed disperser for 2 min to obtain a homogeneous precursor solution.

(4) The precursor solution in the above step (3) was transferred to a transparent polycarbonate (PC) sheet by a spray coating method to achieve uniform dispersion, with the thickness of the precursor solution on the transparent polycarbonate (PC) sheet controlled at 0.005 mm; the transparent polycarbonate (PC) sheet coated with the precursor solution was placed in a vacuum drying oven at the air pressure of 0.05 MPa and the temperature of 70° C., dried for 20 h to remove the organic solvent and obtain a $CH=NHNH_3PbCl_xBr_{3-x}(0 \leq x \leq 3)$ quantum dot/PVDF composite material in bluish green color attached to the transparent polycarbonate (PC) sheet, which appeared in bluish green in the light of a UV lamp.

Example 11

Figure 8:
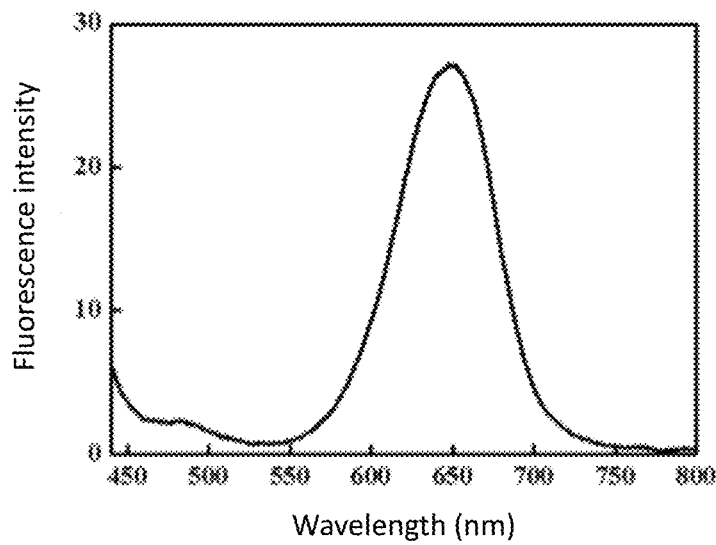
FIG. 8 is a fluorescence emission spectrum of the $CH_3NH_3PbBr_xI_{3-x}$/PVDF composite material in Example 11 of the present invention.

The procedures were the same as in Example 1 except for the following: in the first solution, the mass ratio was controlled as: polymer:organic solvent=1:50, mixing was conducted under mechanical stirring for 12 h and via ultrasonication for 3 h, wherein the polymer was polyvinylidene fluoride (PVDF) and the organic solvent was N, N-dimethylformamide (DMF); in the second solution, the molar ratio of inorganic metal halide:organic amine halide was controlled at 1:1, and the organic solvent was added while controlling the mass ratio of organic solvent:inorganic metal halide=1:0.06, wherein the inorganic metal halide was $PbBr_2$, the organic solvent was N, N-dimethylformamide (DMF), and the organic amine halide was $CH_3NH_3I$; in the precursor solution, the volume ratio of first solution: second solution was controlled at 1:0.07, and 2-ethylhexylamine was added as organic ligand with the mass ratio of the second solution to the organic ligand of 1:0.01, followed by mechanical stirring for 2 h; the precursor solution was transferred to a transparent silica sheet by a casting method, with the thickness of the precursor solution on the transparent silica sheet controlled at 2.5 mm; with the air pressure in the vacuum drying oven at 0.06 MPa and the temperature at 70° C., drying was conducted for 25 h to remove the organic solvent and obtain a $CH_3NH_3PbI_xBr_{3-x}(0 \leqslant x \leqslant 3)$ quantum dot/PVDF composite material in dark red color attached to the transparent silica sheet. FIG. 8 is the fluorescence emission spectra of composite material.

Example 12

The procedures were the same as in Example 11 except for the following: graphene that was soluble in DMF was added to the first solution, with the mass percentage concentration of polymer solution:additive controlled at 1:0.5; in the second solution, the mass ratio of the organic solvent: (inorganic metal halide+organic amine halide) was controlled=1:0.06; the temperature in the vacuum drying oven was set at 90° C. A $CH_3NH_3PbI_xBr_{3-x}(0 \leqslant x \leqslant 3)$ quantum dot/PVDF composite material attached to the transparent silica sheet was obtained.

Example 13

The procedures were the same as in Example 1 except for the following: in the first solution, the mass ratio was controlled as: polymer:organic solvent=1:25, and an additive was added to the above polymer solution while controlling the mass ratio as: polymer solution:additive=1:0.5, followed by ultrasonic mixing for 3 h to mix uniformly, wherein the polymer was polyvinylidene fluoride (PVDF) and the organic solvent was N-methylpyrrolidone (NMP); in the second solution, the molar ratio of inorganic metal halide:organic amine halide was controlled at 1:3, and the mass ratio of organic solvent:inorganic metal halide was controlled at 1:0.07, wherein the inorganic metal halide was $SnI_2$, the organic solvent was N-methylpyrrolidone (NMP), and the organic amine halide was $CH_3NH_3I$; in the precursor solution, the volume ratio of the first solution: second solution was controlled at 1:0.08; the precursor solution was transferred to a polished polytetrafluoroethylene utensil by a casting method, with the thickness of the precursor solution on the polished polytetrafluoroethylene utensil controlled at 3 mm; with the air pressure in the vacuum drying oven at 0.07 MPa and the temperature at 50° C., drying was carried out for 30 h to remove the organic solvent and obtain a $CH_3NH_3SnI_3$ quantum dot/PVDF composite material in black color.

Example 14

The procedures were the same as in Example 1 except for the following: in the first solution, the mass ratio was controlled as: polymer:organic solvent=1:25, and an additive was added while controlling the mass percentage concentration as: polymer solution:additive=1:0.5, followed by ultrasonic mixing for 3 h to mix uniformly, wherein the polymer was polyacrylonitrile (PAN), the additive was carbon nanotubes, and the organic solvent was N-methylpyrrolidone (NMP); in the second solution, the molar ratio of inorganic metal halide:organic amine halide was controlled at 1:3, and the organic solvent was added with the mass ratio of organic solvent:(inorganic metal halide+organic amine halide) controlled at 1:0.07, wherein the inorganic metal halide was $SnI_2$, the organic solvent was N-methylpyrrolidone (NMP), and the organic amine halide was $CH_3NH_3I$; in the precursor solution, the volume ratio of the first solution: second solution was controlled at 1:0.08, and octadecylamine was added as the organic ligand, with the mass ratio of the second solution to the organic ligand at 1:0.02; the precursor solution was transferred to a polished polytetrafluoroethylene utensil by a casting method for uniform dispersion, with the thickness of the precursor solution on the polished polytetrafluoroethylene utensil controlled at 5 mm; with the air pressure in the vacuum drying oven at 0.07 MPa and the temperature at 100° C., drying was conducted for 30 h to remove the organic solvent and obtain a $CH_3NH_3SnI_3$ quantum dot/PAN composite material in black color.

Example 15

Figure 9:
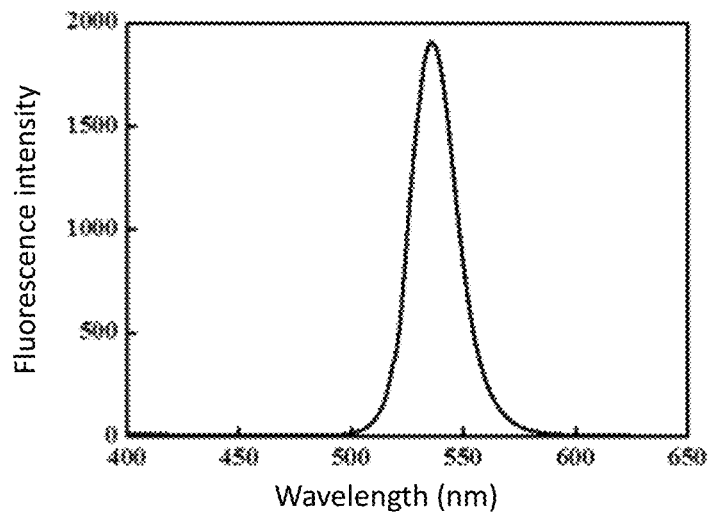
FIG. 9 is a fluorescence emission spectrum of $(C_6H_5NH_3)_2PbBr_4$/PVDF-CNA composite material in Example 15 of the present invention.

The procedures were the same as in Example 1 except for the following: in the first solution, the mass ratio was controlled as: polymer:organic solvent=1:15, the polymer was polyvinylidene fluoride (PVDF), and the organic solvent was N, N-dimethylformamide (DMF); in the second solution, the molar ratio of inorganic metal halide:organic amine halide was controlled at 1:1.5, and the mass ratio of organic solvent:inorganic metal halide was controlled at 1:0.08, wherein the inorganic metal halide was $PbBr_2$, the organic solvent was N, N-dimethylformamide (DMF), and the organic amine halide was phenylethylamine bromide; in the precursor solution, the volume ratio of the first solution: second solution was controlled at 1:0.09; the precursor solution was transferred to a transparent glass sheet by a spin coating method for uniform dispersion, with the thickness of the precursor solution on the transparent glass sheet controlled at 3.5 mm; with the air pressure in the vacuum drying oven at 0.08 MPa and the temperature at 60° C., drying was carried out for 35 h to remove the organic solvent and obtain a $(C_6H_5NH_3)_2PbBr_4$ quantum dot/PVDF composite thin film in light yellow color that could be removed from the glass sheet, with the emission peak position of the composite thin film at 535 nm. FIG. 9 is the fluorescence emission spectra of the composite material.

Example 16

The procedures were the same as in Example 15 except for the following: in the first solution, a mixture of polyvinylidene fluoride (PVDF) and cyano cellulose (CNA) with a mass ratio of 1:1 was used as the polymer; in the second solution, the mass ratio of the organic solvent:(inorganic metal halide+organic amine halide) was controlled at 1:0.08; n-octylamine was added as the organic ligand into the precursor solution, with the mass ratio of the second solution to the organic ligand at 1:0.03; during the transferring of the precursor solution to the glass sheet, the thickness of the precursor solution on the glass sheet was controlled at 0.03 mm. Finally, a $(C_6H_5NH_3)_2PbBr_4$ quantum dot/PVDF composite thin film was obtained.

Example 17

The procedures were the same as in Example 1 except for the following: in the first solution, the mass ratio was controlled as: polymer:organic solvent=1:10, ultrasonic mixing was conducted for 12 h, and an additive was added with the mass ratio as: polymer solution:additive controlled at 1:0.3, followed by ultrasonic mixing for 3 h, wherein the polymer was aromatic polyamide (PA), the additive was polyethylene glycol (PEG), and the organic solvent was N, N-dimethylformamide (DMF); in the second solution, the molar ratio of inorganic metal halide:organic amine halide was controlled at 1:1.5, and the mass ratio of organic solvent:inorganic metal halide was controlled at 1:0.09, wherein the inorganic metal halide was $CuBr_2$, the organic solvent was N, N-dimethylformamide (DMF), and the organic amine halide was $CH_3NH_3Br$; in the precursor solution, the volume ratio of the first solution: second solution was controlled at 1:1; the precursor solution was transferred to a glass culture dish by a casting method for uniform dispersion, with the thickness of the precursor solution on the glass culture dishes controlled at 4 mm; with the air pressure in the vacuum drying oven at 0.09 MPa and the temperature at 70° C., drying was carried out for 40 h to remove the organic solvent and obtain a $CH_3NH_3CuBr_3$ quantum dot/PA composite thin film in dark purple color.

Example 18

The procedures were the same as in Example 1 except for the following: in the first solution, the mass ratio was controlled as: polymer:organic solvent=1:10, ultrasonic mixing was conducted for 12 h, and an additive was added with the mass percentage concentration of polymer solution: additive controlled at 1:0.3, followed by ultrasonic mixing for 3 h to mix uniformly wherein the polymer was polyvinylidene fluoride (PVDF), the additive was graphene soluble in DMF, and the organic solvent was N, N-dimethylformamide (DMF); in the second solution, the molar ratio of inorganic metal halide:organic amine halide was controlled at 1:1.5, and the mass ratio of organic solvent:(inorganic metal halide+organic amine halide) was controlled at 1:0.09, wherein the inorganic metal halide was $CuCl_2$, the organic solvent was N, N-dimethylformamide (DMF), and the organic amine halide was $CH_3NH_3Br$; in the precursor solution, the volume ratio of the first solution: second solution was controlled at 1:1, and oleylamine and n-hexylamine were added as the organic ligand, with the volume ratio of oleylamine to n-hexamine controlled at 1:1 and the mass ratio of the second solution to the organic ligand at 1:0.04; the precursor solution was transferred to a transparent glass sheet by a spin coating method for uniform dispersion, with the thickness of the precursor solution on the glass sheet controlled at 0.05 mm, and the glass sheet coated with the precursor solution was then placed in a vacuum drying oven; with the air pressure in the vacuum drying oven at 0.09 MPa and the temperature at 70° C., drying was carried out for 40 h to remove the organic solvent and obtain a $CH_3NH_3CuCl_xBr_{3-x}$/PVDF composite thin film in dark purple color.

Example 19

The procedures were the same as in Example 1 except for the following: in the first solution, the mass ratio was controlled as: polymer:organic solvent=1:10, ultrasonic mixing was conducted for 12 h, and an additive was added with the mass ratio of polymer solution:additive controlled at 1:0.4, followed by ultrasonic mixing for 3 h, wherein the polymer was polyimide (PI), the additive was polyvinylpyrrolidone (PVP), and the organic solvent was N, N-dimethylformamide (DMF); in the second solution, the molar ratio of inorganic metal halide:organic amine halide was controlled at 1:1.5, the mass ratio of organic solvent:inorganic metal halide was controlled at 1:0.1, the inorganic metal halide was $BiCl_2$, the organic solvent was N, N-dimethylformamide (DMF), and the organic amine halide was phenylethylamine bromide; in the precursor solution, the volume ratio of the first solution: second solution was controlled at 1:0.5; the precursor solution was transferred to a glass petri dishes by a casting method, with the thickness of the precursor solution on the glass petri dishes controlled at 4.5 mm; with the air pressure in the vacuum drying oven at 0.1 MPa and the temperature at 70° C., drying was carried out for 48 h to remove the organic solvent and obtain a $(C_6H_5NH_3)_2BiCl_4$ quantum dot/PI composite thin film in white color.

Example 20

The procedures were the same as in Example 1 except for the following: in the first solution, the mass ratio was controlled as: polymer:organic solvent=1:10, the polymer was polycarbonate (PC), and the organic solvent was N, N-dimethylformamide (DMF); in the second solution, the molar ratio of inorganic metal halide:organic amine halide was controlled at 1:1.5, and the mass ratio of organic solvent:inorganic metal halide was controlled at 1:0.05, wherein the organic solvent was N, N-dimethylformamide (DMF) and the organic amine halide was $CH_3NH_3I$; in the precursor solution, the volume ratio of the first solution: second solution was controlled at 1:0.5; the precursor solution was transferred to a transparent PMMA mold by a casting method, with the thickness of the precursor solution on the transparent PMMA mold controlled at 5 mm; with the air pressure in the vacuum drying oven at 0.01 MPa and the temperature at 30° C., drying was carried out for 48 h to remove the organic solvent and obtain a $CH_3NH_3MnI_3$ quantum dot/PC composite thin film in purplish black color.

Example 21

The procedures were the same as in Example 1 except for the following: in the first solution, the mass ratio was controlled as: polymer:organic solvent=1:10, ultrasonic mixing was conducted for 12 h, and an additive was added with the mass percentage concentration of polymer solution: additive controlled at 1:0.4, followed by ultrasonic mixing for 3 h, wherein the polymer was polyimide (PI), the additive was boron nitride nanosheets, and the organic solvent was N, N-dimethylformamide (DMF); in the second solution, the molar ratio of inorganic metal halide:organic amine halide was controlled at 1:1.5, and the mass ratio of organic solvent:(inorganic metal halide+organic amine halide) was controlled at 1:0.1, wherein the inorganic metal halide was $BiCl_2$, the organic solvent was N, N-dimethylformamide (DMF); and the organic amine halide was phenylethylamine bromide; in the precursor solution, the volume ratio of the first solution: second solution was controlled at 1:0.5, and oleic acid and n-octylamine were added as organic ligands, with the volume ratio of oleic acid to n-octylamine controlled at 1:1 and the mass ratio of the second solution to the organic ligand at 1:0.05; the precursor solution was transferred to a glass petri dish by a casting method, with the thickness of the precursor solution on the glass petri dishes controlled at 4 mm; with the air pressure in the vacuum drying oven at 0.1 MPa and the temperature at 70° C., drying was carried out for 48 h to remove the organic solvent and obtain a $(C_6H_5NH_3)_2BiCl_4$ quantum dot/PI composite material in white color.

Example 22

The procedures were the same as in Example 1 except for the following: in the first solution, the mass ratio was controlled as: polymer:organic solvent=1:10, the polymer was polycarbonate (PC), and the organic solvent was N, N-dimethylformamide (DMF); in the second solution, the molar ratio of inorganic metal halide:organic amine halide was controlled at 1:1.5, and the mass ratio of organic solvent:(inorganic metal halide+organic amine halide) was controlled at 1:0.05, wherein the inorganic metal halide was $MnI_2$, the organic solvent was N, N-dimethylformamide (DMF), and the organic amine halide was $CH_3NH_3I$; in the precursor solution, the volume ratio of the first solution: second solution was controlled at 1:0.5, and then hexanoic acid and dodecylamine were added as organic ligands, with the volume ratio of hexanoic acid to dodecylamine controlled at 1:1 and the mass ratio of the second solution to the organic ligand at 1:0.02; the precursor solution was transferred to a transparent PMMA mold by a spin coating method, with the thickness of the precursor solution on the transparent PMMA mold controlled at 0.07 mm; with the air pressure of the vacuum drying oven at 0.01 MPa and the temperature at 30° C., drying was carried out for 48 h to remove the organic solvent and obtain a $CH_3NH_3MnI_3$ quantum dot/PC composite material in purplish black color.

Example 23

The procedures were the same as in Example 1 except for the following: in the first solution, the mass ratio was controlled as: polymer:organic solvent=1:10, the polymer was polystyrene (PS), and the organic solvent was N, N-dimethylformamide (DMF); in the second solution, the molar ratio of inorganic metal halide:organic amine halide was controlled at 1:1.5, and the mass ratio of organic solvent:inorganic metal halide was controlled at 1:0.05, wherein the inorganic metal halide was $SbCl_2$, the organic solvent was N, N-dimethylformamide (DMF), and the organic amine halide was $CH_3NH_3Cl$; in the precursor solution, the volume ratio of the first solution: second solution was controlled at 1:0.5; the precursor solution was transferred to a transparent quartz glass sheet by spin coating method, with the thickness of the precursor solution on the transparent quartz glass sheet controlled at 0.5 mm; with the air pressure in the vacuum drying oven at 0.01 MPa and the temperature at 70° C., drying was carried out for 8 h to remove the organic solvent and obtain a $CH_3NH_3SbCl_3$ quantum dot/PS composite material in white color.

Example 24

The procedures were the same as in Example 1 except for the following: in the first solution, the mass ratio was controlled as: polymer:organic solvent=1:15, the polymer was polystyrene (PS); and the organic solvent was N, N-dimethylformamide (DMF); in the second solution, the molar ratio of inorganic metal halide:organic amine halide was controlled at 1:1.5, and the mass ratio of organic solvent:(inorganic metal halide+organic amine halide) was controlled at 1:0.05, wherein the inorganic metal halide was $SbCl_2$, the organic solvent was N, N-dimethylformamide (DMF), and the organic amine halide was $CH_3NH_3Cl$; in the precursor solution, the volume ratio of the first solution: second solution was controlled at 1:0.7, and then oleic acid was added as the organic ligand, with the mass ratio of the second solution to the organic ligand at 1:0.04; the precursor solution to a transparent quartz glass sheet by spin coating method with the thickness of the precursor solution on the transparent quartz glass sheet controlled at 0.25 mm; with the air pressure in the vacuum drying oven at 0.01 MPa and the temperature at 70° C., drying was carried out for 8 h to remove the organic solvent and obtain a $CH_3NH_3SbCl_3$ quantum dot/PS composite material in white color.

Example 25

The procedures were the same as in Example 1 except for the following: in the first solution, the mass ratio was controlled as: polymer:organic solvent=1:10, the polymer was polyvinylidene fluoride (PVDF), and the organic solvent was dimethylacetamide (DMAc); in the second solution, the molar ratio of inorganic metal halide:organic amine halide was controlled at 1:1.5, and the mass ratio of organic solvent:inorganic metal halide was controlled at 1:0.05, wherein the inorganic metal halide was $SnI_2$, the organic solvent was dimethylacetamide (DMAc), and the organic amine halide was $CH_2=CHCH_2CH_3NH_3I$; in the precursor solution, the volume ratio of the first solution: second solution was controlled at 1:0.5; the precursor solution was transferred to an ITO glass by spin coating method, with the thickness of the precursor solution on the ITO glass controlled at 0.2 mm; with the air pressure of the vacuum drying oven at 0.02 MPa and the temperature at 30° C., drying was carried out for 48 h to remove the organic solvent and obtain a $(CH_2=CHCH_2CH_3NH_3)_2SnI_4$ quantum dot/PVDF composite material in red color.

Example 26

The procedures were the same as in Example 1 except for the following: in the first solution, the mass ratio was controlled as: polymer:organic solvent=1:5, the polymer was aromatic polyamide (PA); the organic solvent was dimethylacetamide (DMAc); in the second solution, the molar ratio of inorganic metal halide:organic amine halide was controlled at 1:1.5, and the mass ratio of organic solvent:(inorganic metal halide+organic amine halide) was controlled at 1:0.02, wherein the inorganic metal halide was $SnI_2$, the organic solvent was dimethylacetamide (DMAc), and the organic amine halide was $CH_2=CHCH_2CH_3NH_3I$; in the precursor solution, the volume ratio of the first solution: second solution was controlled at 1:0.8, and then valeric acid and 3-vinylhexylamine were added as the organic ligand, with mass ratio of the second solution to the organic ligand at 1:0.04; the precursor solution was transferred to an ITO glass by spin coating method, with the thickness of the precursor solution on the ITO glass controlled at 0.1 mm; with the air pressure in the vacuum drying oven at 0.02 MPa and the temperature at 30° C., drying was carried out for 48 h to remove the organic solvent and obtain a $(CH_2=CHCH_2CH_3NH_3)_2SnI_4$ quantum dot/PA composite material in red color.

Example 27

Figure 10:
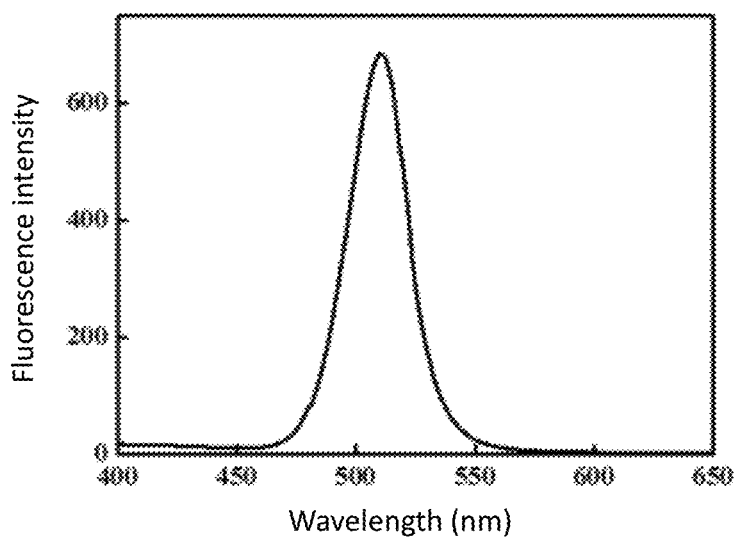
FIG. 10 is a fluorescence emission spectrum of the $CH_3NH_3PbBr_3$/PVDF-CA composite material in Example 27 of the present invention.
Figure 11:
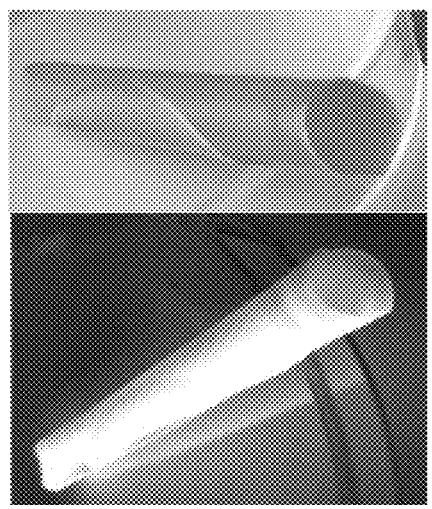
FIG. 11 shows the physical appearance of the $CH_3NH_3PbBr_3$ quantum dot/PVDF-CA flexible composite film in Example 27 of the present invention in daylight and in the light of an ultraviolet lamp.

The procedures were the same as in Example 1 except for the following: in the first solution, the mass ratio was controlled as: polymer:organic solvent=1:10, the polymer was a mixture of polyvinylidene fluoride (PVDF) and cellulose acetate (CA), and the organic solvent was dimethylacetamide (DMAc); in the second solution, the molar ratio of inorganic metal halide:organic amine halide was controlled at 1:1.5, and the mass ratio of organic solvent: inorganic metal halide was controlled at 1:0.05, wherein the inorganic metal halide was $PbBr_2$, the organic solvent was dimethylacetamide (DMAc), and the organic amine halide was $CH_3NH_3Br$; in the precursor solution, the volume ratio of the first solution: second solution was controlled at 1:0.5; the precursor solution was transferred to an FTO glass by spin coating method, with the thickness of the precursor solution on the ITO glass controlled at 0.3 mm; with the air pressure of the vacuum drying oven at 0.02 MPa and the temperature at 30° C., drying was carried out for 48 h to remove the organic solvent and obtain a $CH_3NH_3PbI_3$ quantum dot/PVDF-CA composite thin film in red color that could be removed from the glass sheet, had very good flexibility, and emitted strong green light in the light of a UV lamp at 365 nm. The composite thin film showed an emission peak positioned at 515 nm as measured by a fluorescence spectrometer. FIG. 10 is the fluorescence emission spectra of the obtained $CH_3NH_3PbBr_3$ quantum dot/PVDF-CA flexible composite thin film. FIG. 11 shows the physical appearance of the obtained $CH_3NH_3PbBr_3$ quantum dot/PVDF-CA flexible composite film in daylight and in the light of an ultraviolet lamp.

Example 28

The procedures were the same as in Example 1 except for the following: in the first solution, the mass ratio was controlled as: polymer:organic solvent=1:35, ultrasonic mixing was conducted for 12 h, and an additive was added with the mass percentage concentration of polymer solution: additive controlled at 1:0, followed by ultrasonic mixing for 3 h, wherein the polymer was a mixture of polyvinylidene fluoride (PVDF) and cellulose acetate (CA) and the organic solvent was dimethylacetamide (DMAc); in the second solution, the molar ratio of inorganic metal halide:organic amine halide was controlled at 1:1.5, and the mass ratio of organic solvent:inorganic metal halide was controlled at 1:0.01, wherein the inorganic metal halide was $PbBr_2$, the organic solvent was dimethylacetamide (DMAc), and the organic amine halide was $CH_3NH_3Br$; in the precursor solution, the volume ratio of the first solution: second solution was controlled at 1:0.4, and then 1,2-diphenylethylamine was added as organic ligand, with the mass ratio of the second solution to the organic ligand at 1:0.04; the precursor solution was transferred to an FTO glass by spin coating method, with the thickness of the precursor solution on the FTO glass at 0.75 mm; with the air pressure of the vacuum drying oven at 0.02 MPa and the temperature at 30° C., drying was carried out for 48 h to remove the organic solvent and obtain a $CH_3NH_3PbBr_3$ quantum dot/PVDF-CA composite thin film in green color that could be removed from the glass sheet, had very good flexibility, and emitted strong green light in the light of a UV lamp at 365 nm. The composite thin film showed an emission peak positioned at 515 nm as measured by a fluorescence spectrometer.

Example 29

The procedures were the same as in Example 1 except for the following: in the first solution, the mass ratio was controlled as: polymer:organic solvent=1:35, the polymer was polyvinylidene fluoride (PVDF), and the organic solvent was dimethylacetamide (DMAc); in the second solution, the organic solvent was added to the inorganic metal halide with the mass ratio of organic solvent:inorganic metal halide controlled at 1:0.01, a small amount of deionized water was added to cesium halide with the mass ratio of deionized water:cesium halide controlled at 1:1, and the aqueous solution of cesium halide was slowly added to the organic solvent with the inorganic metal halide; after mixing, ultrasonic treatment was conducted for 15 minutes to obtain a transparent mixed solution, and the transparent mixed solution upon ultrasonic treatment was filtered and the obtained filtrate was used as the second solution, wherein the inorganic metal halide was $PbBr_2$, the organic solvent was dimethylacetamide (DMAc), and the cesium halide was CsCl; in the precursor solution, the volume ratio of the first solution: second solution was controlled at 1:0.4, and then 2-butyl tetradecylamine was added as organic ligand, with the mass ratio of the second solution to the organic ligand at 1:0.04; the precursor solution was transferred to an ITO glass by spin coating method, with the thickness of the precursor solution on the ITO glass controlled at 0.075 mm; with the air pressure in the vacuum drying oven at 0.02 MPa and the temperature was 30° C., drying was carried out for 48 h to obtain a $CsPbBr_xCl_{3-x}$ quantum dot/PVDF composite thin film in light green color that could be removed from the glass sheet, had very good flexibility, and emitted blue light in the light of a UV lamp at 365 nm. The composite thin film showed an emission peak positioned at 450 nm as measured by a fluorescence spectrometer.

Example 30

The procedures were the same as in Example 29 except for the following: in the first solution, the mass ratio was controlled as: polymer:organic solvent=1:35, ultrasonic mixing was conducted for 12 h, an additive was added with the mass percentage concentration of polymer solution: additive controlled at 1:0, followed by ultrasonic mixing for 3 h, wherein the polymer was copolymer of polyvinylidene fluoride and trifluoroethylene (P(VDF-TrFE)) and the organic solvent was N, N-dimethylformamide (DMF); in the second solution, the molar ratio of inorganic metal halide: cesium halide was controlled at 1:1, and the mass ratio of organic solvent:inorganic metal halide was controlled at 1:0.01, wherein the inorganic metal halide was $PbI_2$, the organic solvent was N, N-dimethylformamide (DMF), and the cesium halide was CsBr; in the precursor solution, the volume ratio of the first solution: second solution was controlled at 1:0.4, and then 1-phenylethylamine was added as organic ligand with the mass ratio of the second solution to the organic ligand at 1:0.04; the precursor solution was transferred to an ITO glass by spin coating method, with the thickness of the precursor solution on the ITO glass controlled at 0.06 mm; with the air pressure in the vacuum drying oven at 0.02 MPa and the temperature at 30° C., drying was carried out for 48 h to remove the organic solvent and obtain a $CsPbBr_xI_{3-x}$ quantum dot/P(VDF-TrFE) composite thin film in dark red color that could be removed from the glass sheet, had very good flexibility, and emitted red light in the light of a UV lamp at 365 nm. The composite thin film showed an emission peak positioned at 630 nm as measured by a fluorescence spectrometer.

Example 31

Based on the $CH_3NH_3PbBr_3$ quantum dot/PVDF composite material prepared in Example 5, a white LED device with high color gamut was prepared by the following steps in detail:

(1) Preparation of a Silica Resin/Red Phosphor Powder Mixed Solution

A total of 5 g of silica gel 6550A and 6550B were placed in a 25 mL small beaker with a mass ratio of 1:1, and stirred for 10 minutes with a glass rod; then, 1 g of red phosphor powder (KSF) was weighed and placed into the small beaker and the stirring was resumed for 10 minutes to mix uniformly before the bubbles generated during the stirring were removed by means of vacuum suction, and the mixed solution was ready for use.

(2) Preparation of Silica Resin/Red Phosphor Powder Composite Thin Layer

The mixed solution prepared in step (1) was uniformly coated on a glass sheet with a smooth surface, and then cured in a baking oven at 150° C. for 1 hour, to obtain a red light-emitting silica/KSF composite thin film ready for use.

(3) Preparation of a High Color Gamut White LED Device

Figure 12:
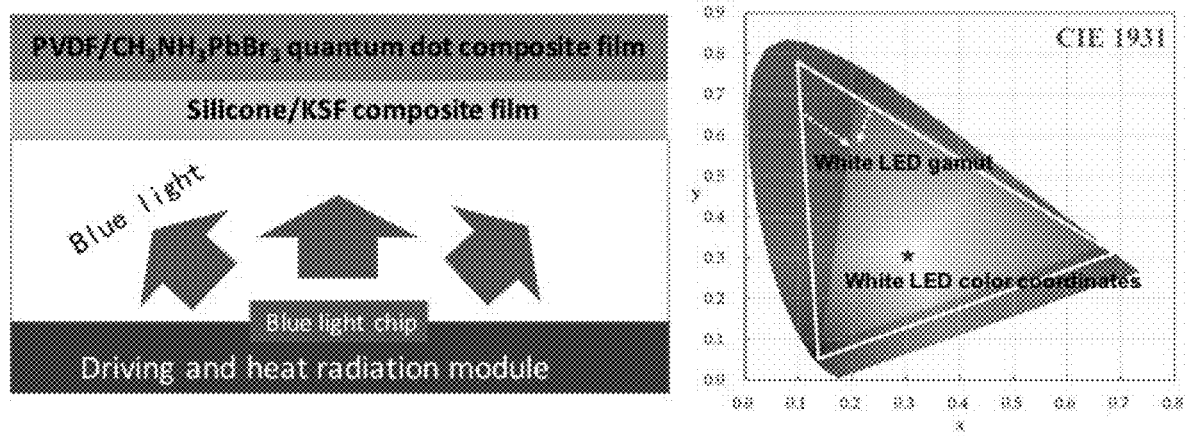
FIG. 12 is a schematic diagram of the structure of the photoluminescent device constructed in Example 31 of the present invention and the color coordinate diagram of the prepared high color gamut white LED.

The prepared $CH_3NH_3PbBr_3$ quantum dot/PVDF composite thin film and the silica/KSF composite thin film prepared in step (2) were assembled and applied to a white LED device structure to obtain a white LED device with high color gamut. FIG. 12 is the structural schematic diagram of the white LED device and the color coordinate diagram of the prepared high color gamut white LED.

The KSF red phosphor powder used in the present embodiment was synthesized according to the method disclosed in the invention patent with Patent Number of CN103429701A, entitled "Color-stabilized manganese-doped phosphors", which can also be provided by Beijing Institute of Technology.

Example 32

Based on the $CH_3NH_3PbBr_3$ quantum dot/PVDF composite material prepared in Example 5 and the $CH_3NH_3PbBr_xI_{3-x}$ quantum dot/PVDF composite material prepared in Example 11, a white LED device with high color gamut was prepared by the following steps in detail:

(1) Preparation of a $CH_3NH_3PbBr_3I_{3-x}$ Quantum Dot/PVDF Light-Emitting Layer A precursor solution was formulated according to the experimental setup in Example 5, and the precursor solution was taken up and transferred to a reflective cup of a SMD blue LED with a dropper, with the thickness of the precursor solution controlled at 0.2 mm; then the SMD blue LED comprising the precursor solution was placed in a vacuum drying oven and dried for 2 h at 0.01 MPa and 70° C. before it was removed to be ready for use.

(2) Preparation of a Polymethylmethacrylate (PMMA) Thin Interlayer 0.5 g of PMMA powder was weighed and placed in a 10 mL glass bottle, into which chloroform as solvent measured at 5 mL was added, ultrasonic mixed for 4 h to obtain a transparent PMMA solution; the PMMA solution was taken up and coated on top of the $CH_3NH_3PbBr_xI_{3-x}$ quantum dot/PVDF light emitting layer of the SMD blue LED prepared in step (1) with a dropper, with the thickness of the PMMA solution controlled at less than 0.1 mm, which was placed in a vacuum drying oven and dried for 5 h at 0.05 MPa and 50° C. before it was removed to be ready for use.

(3) Preparation of a $CH_3NH_3PbBr_3$ Quantum Dot/PVDF Light Emitting Layer

The precursor solution was formulated according to the experimental setup in Example 3, and the precursor solution was taken up and transferred on top of the PMMA thin film in the SMD blue LED prepared in step (2) by using a dropper, with the thickness of the precursor solution controlled 0.1 mm, and then placed in a vacuum drying oven and dried for 2 h at 0.01 MPa and 70° C. before it was removed to obtain a white LED light emitting device with high color gamut.

Example 33

Based on the perovskite/polymer composite luminescent material prepared in Example 5, a high-color gamut backlight for liquid crystal display (LCD) was prepared, and with 42-inch LCD as an example, the steps in detail were as follows:

(1) Preparation of a 42-Inch $CH_3NH_3PbBr_xI_{3-x}$ Quantum Dot/PVDF Light Emitting Layer A precursor solution of a desired mass was prepared according to the experimental setup in Example 11, and the precursor solution was uniformly transferred to a glass substrate of a corresponding size by using a blade coating machine, with the thickness of the precursor solution controlled at 0.2 mm; then the glass substrate comprising the precursor solution was placed in a vacuum drying oven and dried at 0.01 MPa and 70° C. for 2 h before it was removed for use; and then, the prepared $CH_3NH_3PbBr_xI_{3-x}$ quantum dot/PVDF light emitting film was transferred to the light guide plate, the diffusion film, or the prism film in an LCD backlight module. In order to simplify the process, the above-mentioned precursor solution can also be directly transferred onto the light guide plate, the diffusion film, or the prism film in the LCD backlight module by the blade coating machine, and then dried under the same conditions to form an integrated light emitting layer.

(2) Preparation of a 42-Inch $CH_3NH_3PbBr_3$ Quantum Dot/PVDF Light Emitting Layer The precursor solution was prepared according to the experimental setup in Example 5, and the precursor solution was uniformly transferred to a substrate by using a blade coating machine, wherein the substrate used included a glass plate or a light guide plate, a diffusion film, a prism film in a LCD backlight module, with the thickness of the precursor solution controlled at 0.1 mm; the substrate was placed in a vacuum drying oven and dried at 0.01 MPa and 70° C. for 2 h before it was removed to obtain a $CH_3NH_3PbBr_3$ quantum dot/PVDF light-emitting film with high luminous efficiency.

(3) Assembly of the LCD Backlight Module

The light-emitting films obtained in step (1) and (2) were inserted into the LCD backlight module, and the light source of the LCD backlight module could be replaced with a blue light source. Blue light passed through a light guide plate and then through a red light-emitting layer and a green light-emitting layer, and white light combining the three primary colors, red, green, and blue, was eventually generated.

Example 34

The present example was based on a perovskite/polymer composite luminescent material, and the piezoelectric device was prepared by the following steps in detail:

(1) The precursor solution was prepared according to the experimental setup in Example 18, and then uniformly coated on a substrate, wherein the substrate used included an ITO conductive glass or a PET or PC flexible polymer substrate with a surface coated with gold/silver, with the thickness of the precursor solution controlled at 0.1 mm; the substrate was placed in a vacuum drying oven and dried at 0.01 MPa, 70° C. for 2 h before a $CH_3NH_3CuCl_xBr_{3-x}$/PVDF composite thin film was obtained.

(2) A gold electrode or silver electrode was plated on the surface of the prepared $CH_3NH_3CuCl_xBr_{3-x}$/PVDF composite thin film, and then a protective layer was coated on top of the electrode to obtain a simple piezoelectric device prototype, and two poles of the composite film-based piezoelectric device were connected to a oscilloscope with conductive wires.

(3) A periodic force was applied to the prepared composite film-based piezoelectric device, and a periodic pulse voltage signal could be observed on the oscilloscope.

What is claimed is:

1. A composite luminescent material, characterized by comprising:
    a matrix; and
    perovskite nanoparticles, the perovskite nanoparticles being dispersed in the matrix, wherein the mass ratio of the perovskite nanoparticles to the matrix is 1:(1 to 50);
    wherein the matrix is composed of polymers,
    and wherein the polymers comprise at least one of polyvinylidene fluoride (PVDF), copolymer of polyvinylidene fluoride and trifluoroethylene (P(VDF-TrFE)), polyacrylonitrile (PAN), polyvinyl acetate (PVAc), cellulose acetate (CA), cyano cellulose (CNA) and polysulfone (PSF).

2. The composite luminescent material according to claim 1, characterized in that the mass ratio of the perovskite nanoparticles to the matrix is 1:(2 to 50).

3. The composite luminescent material according to claim 1, characterized in that the size of the perovskite nanoparticles is no more than 10 nm in at least one dimension; the perovskite nanoparticles have a core with a formula of $CsAB_3$ or $R_1NH_3AB_3$ or $(R_2NH_3)_2AB_4$ in which A and B form a coordinated octahedral structure, with $R_1NH_3$ or $R_2NH_3$ filling the interstices of the octahedral structure,
    wherein $R_1$ is methyl, $R_2$ is a saturated alkyl group or an unsaturated alkyl group with more than 4 carbon atoms, or an ethyl group, A is Ge, Sn, Pb, Sb, Bi, Cu or Mn, and B is at least one selected from Cl, Br, and I.

4. The composite luminescent material according of claim 3, characterized in that the perovskite nanoparticle further comprises: a surface ligand formed on the surface of the core, the surface ligand being an organic acid or a long chain organic amine; the organic acid comprises a saturated alkyl acid or an unsaturated alkyl acid with at least 3 carbon atoms; the long-chain organic amine is an alkyl amine or an aromatic amine with 4 to 24 carbon atoms.

5. The composite luminescent material according to claim 1, characterized by further comprising an additive, the additive being dispersed in the matrix;
    wherein the additive contains at least one of silica, boron nitride nanosheets, graphene, and carbon nanotubes.

6. A method for preparing the composite luminescent material according to claim 1, characterized by comprising:
    (1) dissolving a matrix in a first organic solvent to obtain a first solution;
    (2) dissolving an inorganic metal halide and an organic amine halide in a second organic solvent to obtain a second solution;
    (3) mixing the first solution with the second solution to form a precursor solution;
    (4) transferring the precursor solution onto a template; and
    (5) drying the template with the precursor solution to obtain the composite luminescent material.

7. The method according to claim 6, characterized in that the first organic solvent and the second organic solvent each are independently selected from at least one of N,N-dimethylformamide (DMF), dimethylsulfoxide (DMSO), trimethylphosphate (TMP), triethylphosphate (TEP), N-methylpyrrolidone (NMP), dimethylacetamide (DMAc), wherein the first organic solvent is miscible with the second organic solvent.

8. The method according to claim 6, characterized in that the inorganic metal halide is at least one of the halide salt of Ge, Sn, Pb, Sb, Bi, Cu, and Mn; and
    the organic amine halide salt has a general formula of $RNH_3B$, wherein R is a saturated alkyl group, an unsaturated alkyl group, or a phenylethyl group; and B is at least one selected from Cl, Br, or I.

9. The method according to claim 8, characterized in that the saturated alkyl group is methyl, ethyl, or a long chain saturated alkyl group with more than 4 carbon atoms.

10. The method according to claim 6, characterized in that in the first solution, the mass ratio of the matrix to the first organic solvent is 1:(1 to 50);
    in the second solution, the molar ratio of the inorganic metal halide to the organic amine halide salt is 1:(0.1 to 3), the mass ratio of the second organic solvent to the inorganic metal halide is 1:(0.01 to 0.1), and the mass ratio of the second organic solvent to the sum of the inorganic metal halide and the organic amine halide salt is 1:(0.01 to 0.1);
    in the precursor solution, the mass ratio of the first solution to the second solution is 1:(0.02 to 1).

11. The method according to claim 6, characterized in that the first solution further comprises an additive which comprises at least one of silica, boron nitride nanosheets, graphene, and carbon nanotubes, and that the mass ratio of the matrix to the additive is 1:(0.01 to 0.5).

12. The method according to claim 11, characterized in that the first solution is prepared by the following steps:
    dissolving the matrix in the first organic solvent, with a mass ratio of the matrix to the first organic solvent of 1:(1 to 50), mechanically stirring and mixing for 12 hours so that the matrix is completely dissolved to obtain a transparent mixed solution, adding the additive into the transparent mixed solution, with a mass ratio of the matrix to the additive of 1:(0.01 to 0.5), and mechanically stirring and mixing for 1-3 h to mix uniformly and obtain the first solution.

13. The method according to claim 6, characterized in that, after step (3) and before step (4), the method further comprises:
    adding a surface ligand to the precursor solution, wherein the surface ligand is an organic acid or a long chain organic amine and the mass ratio of the second solution to the surface ligand is 1:(0.001 to 0.3);
    wherein the organic acid comprises a saturated or an unsaturated alkyl acid with at least three carbon atoms, and the long chain organic amine is an alkyl or an aromatic amine with 4-24 carbon atoms.

14. The method according to claim 13, characterized in that the precursor solution is prepared by the following steps:
    mixing the first solution and the second solution, with a mass ratio of the first solution to the second solution of 1:(0.02 to 1), adding the surface ligand with a mass ratio of the second solution to the surface ligand of 1:(0.001 to 0.3), and mechanically stirring for 2 h so as to obtain the precursor solution.

15. The method according to claim 6, characterized in that in step (4), the precursor solution is transferred to the template by spin coating method, dip coating method, electrospinning method, solution depositing method, spray coating method, sblade coating method or casting method.

16. The method according to claim 6, characterized in that in step (5), the drying is a vacuum drying at a pressure of 0.01 to 0.1 MPa, a temperature of 20 to 110° C., and a drying duration of 0.5 to 48 h; the thickness of the composite luminescent material obtained by the vacuum drying is 0.001 to 5 mm.

17. The method according to claim 6, characterized in that the first solution is prepared by the following steps:
dissolving the matrix in the first organic solvent, with a mass ratio of the matrix to the first organic solvent of 1:(1 to 50), and mechanically stirring and mixing for 12 hours so that the matrix is completely dissolved to obtain a transparent mixed solution so as to obtain the first solution; the second solution is prepared by the following steps:
mixing the inorganic metal halide with the organic amine halide salt, with a molar ratio of the inorganic metal halide to the organic amine halide salt of 1:(0.1 to 3), adding the obtained mixture into the second organic solvent before it is subjected to ultrasonic treatment for 15 minutes, with a mass ratio of the second organic solvent to the inorganic metal halide of 1:(0.01 to 0.1), and a mass ratio of the second organic solvent to the sum of the inorganic metal halide and the organic amine halide of 1:(0.01 to 0.1), subjecting the mixture upon ultrasonic treatment to a filtering treatment, and using the filtrate as the second solution;
the precursor solution is prepared by the following steps:
mixing the first solution and the second solution, with a mass ratio of the first solution to the second solution of 1:(0.02 to 1), and mechanically stirring for 2 hours so as to obtain the precursor solution.

18. A semiconductor device, characterized by comprising the composite luminescent material according to claim 1.

19. The semiconductor device according to claim 18, characterized in that the semiconductor device is an electroluminescent device, a photoluminescent device, a solar cell, a display device, a sensing device, or a nonlinear optical device; the semiconductor device is a flexible device, and the substrate of the flexible device is formed by the composite luminescent material.

20. The semiconductor device according to claim 18, characterized in that the semiconductor device is an LCD display device, and the composite luminescent material is arranged on an upper surface or a lower surface of a light guide plate, diffusion film or a prism film in an LCD backlight module of the LCD display device.

\* \* \* \* \*